US012685235B2
(12) United States Patent

Hsu et al.

(10) Patent No.: US 12,685,235 B2

(45) Date of Patent: Jul. 14, 2026

(54) FINE PITCH CHIP INTERCONNECT STRUCTURE FOR BUMP BRIDGE AND HIGH TEMPERATURE STORAGE IMPROVEMENT AND METHODS FOR FORMING THE SAME

(71) Applicant: Taiwan Semiconductor Manufacturing Company Limited, Hsinchu (TW)

(72) Inventors: Wei-Chieh Hsu, Hsinchu (TW); Han-Hsiang Huang, Hsinchu (TW); Yu-Sheng Lin, Zhubei City (TW); Chien-Sheng Chen, Hsinchu (TW); Shin-Puu Jeng, Po-Shan Village (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 425 days.

(21) Appl. No.: 17/709,627

(22) Filed: Mar. 31, 2022

(65) Prior Publication Data

US 2023/0317577 A1 Oct. 5, 2023

(51) Int. Cl.
| | |
|---|---|
| *H01L 23/498* | (2006.01) |
| *H01L 21/48* | (2006.01) |
| *H10W 70/05* | (2026.01) |
| *H10W 70/66* | (2026.01) |
| *H10W 90/00* | (2026.01) |
| *H10W 74/15* | (2026.01) |

(52) U.S. Cl.
CPC ....... *H10W 90/701* (2026.01); *H10W 70/093* (2026.01); *H10W 70/66* (2026.01); *H10W*

*90/00* (2026.01); *H10W 74/15* (2026.01); *H10W 90/724* (2026.01); *H10W 90/734* (2026.01)

(58) Field of Classification Search
None
See application file for complete search history.

(56) References Cited

U.S. PATENT DOCUMENTS

| | | | | |
|---|---|---|---|---|
| 5,268,072 A * | 12/1993 | Agarwala | ............... | H01L 24/11 |
| | | | | 216/13 |
| 6,492,197 B1 * | 12/2002 | Rinne | .................... | H01L 24/12 |
| | | | | 257/781 |
| 2007/0023919 A1 * | 2/2007 | Lin | ........................ | H01L 24/12 |
| | | | | 257/E23.021 |
| 2011/0101526 A1 * | 5/2011 | Hsiao | ..................... | H01L 24/16 |
| | | | | 257/E23.141 |
| 2011/0186989 A1 * | 8/2011 | Hsiao | ..................... | H01L 21/44 |
| | | | | 257/737 |
| 2011/0309497 A1 * | 12/2011 | Wang | ..................... | H01L 24/48 |
| | | | | 257/737 |
| 2012/0007230 A1 * | 1/2012 | Hwang | ................... | H01L 24/11 |
| | | | | 257/737 |
| 2014/0027900 A1 * | 1/2014 | Chiu | .................... | H01L 23/562 |
| | | | | 257/737 |

(Continued)

*Primary Examiner* — Lawrence C Tynes, Jr.

(74) *Attorney, Agent, or Firm* — The Marbury Law Group, PLLC

(57) ABSTRACT

An interconnect structure includes a lower pad including a first conductive layer having a first diameter, and a second conductive layer on the first conductive layer and having a second diameter less than the first diameter, an upper bump on the lower pad and having a third diameter less than the first diameter, and a solder joint between the upper bump and the lower pad.

20 Claims, 20 Drawing Sheets

(56)          References Cited

U.S. PATENT DOCUMENTS

2014/0206143 A1*  7/2014  Colgan ................... H01L 24/81
                                                      438/109
2014/0291838 A1*  10/2014  Chen .................... H01L 23/485
                                                      257/737
2015/0262952 A1*  9/2015  Lee ........................ H01L 24/13
                                                      257/737
2015/0279890 A1*  10/2015  Spartiotis ......... H01L 27/14661
                                                      257/428
2019/0096836 A1*  3/2019  Noh ........................ H01L 24/13
2019/0189577 A1*  6/2019  Chen ...................... H01L 24/11
2022/0199577 A1*  6/2022  Park ................... H01L 25/0652

* cited by examiner

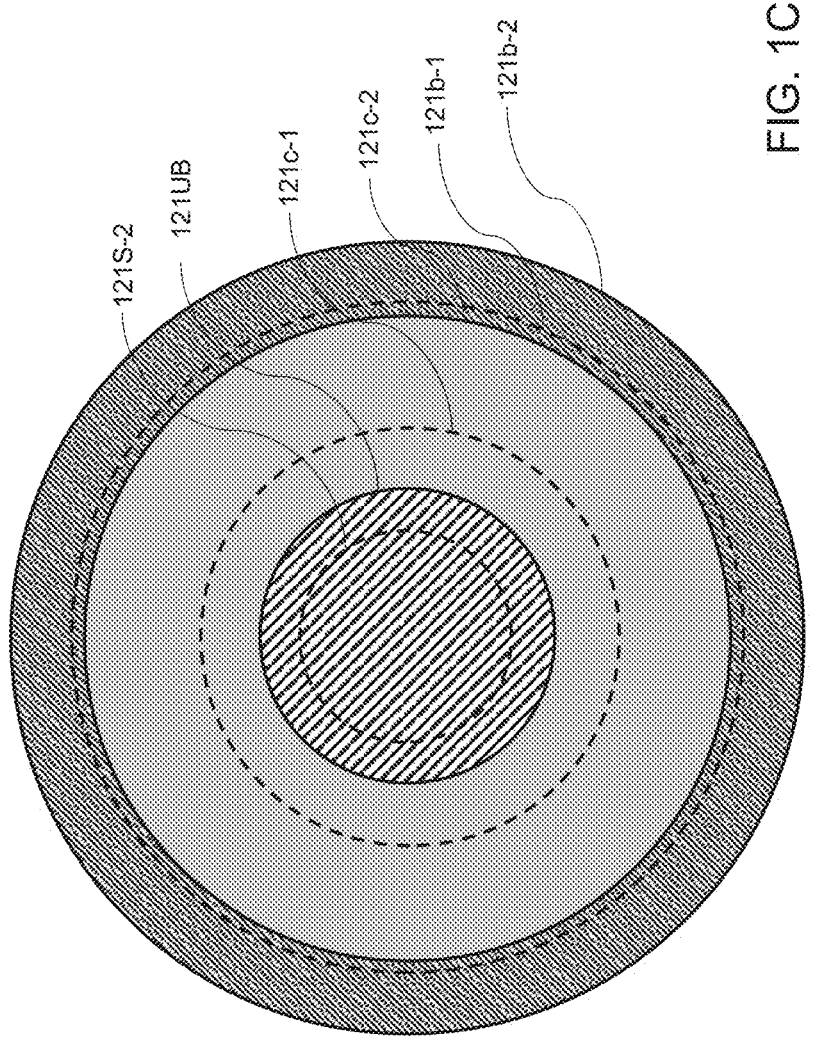
121S-2
121UB
121c-1
121c-2
121b-1
121b-2
FIG. 1C
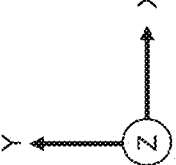

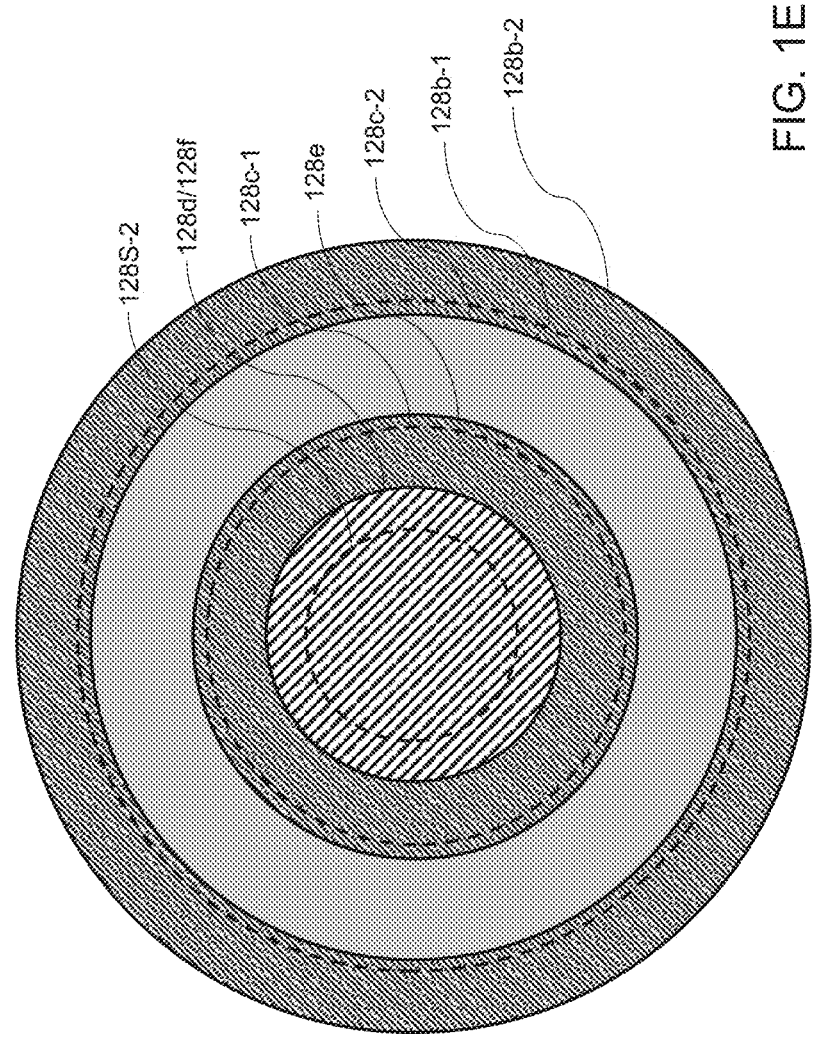
128S-2
128d/128f
128c-1
128e
128c-2
128b-1
128b-2
FIG. 1E
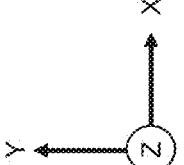

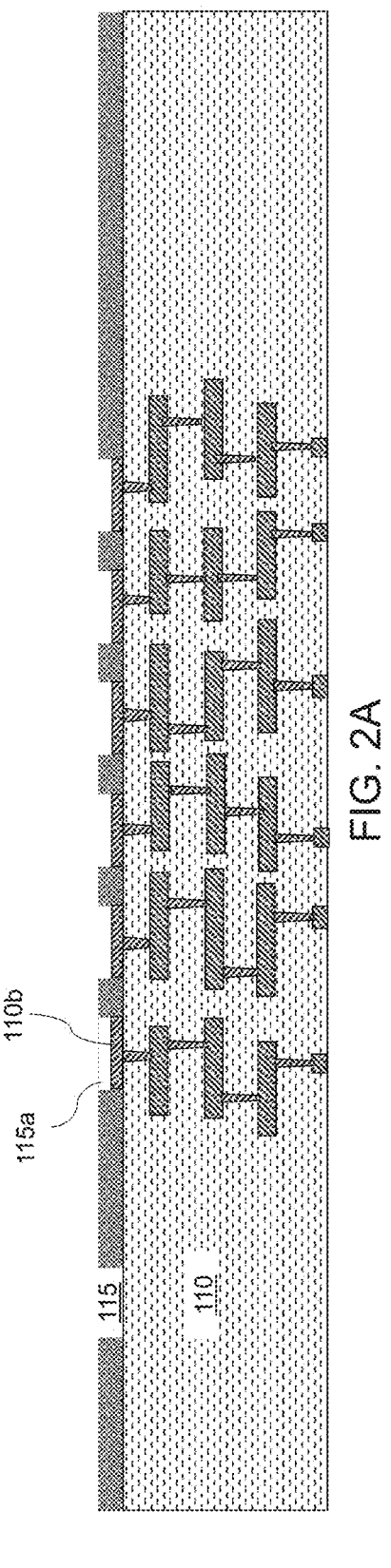
FIG. 2A
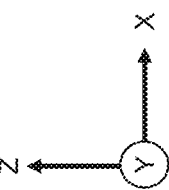

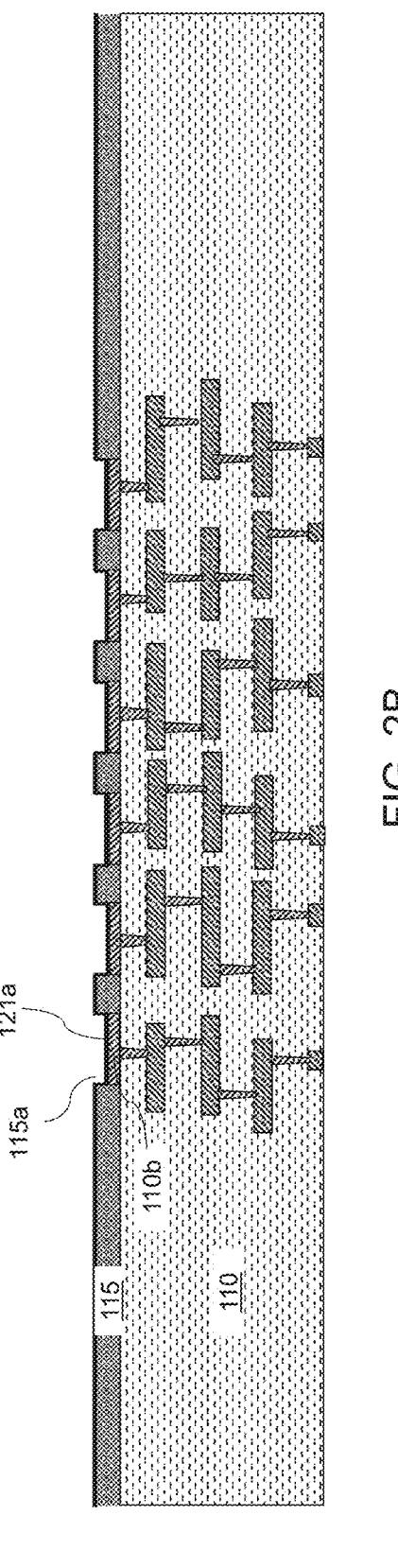
FIG. 2B
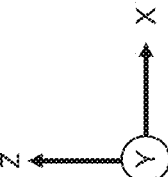

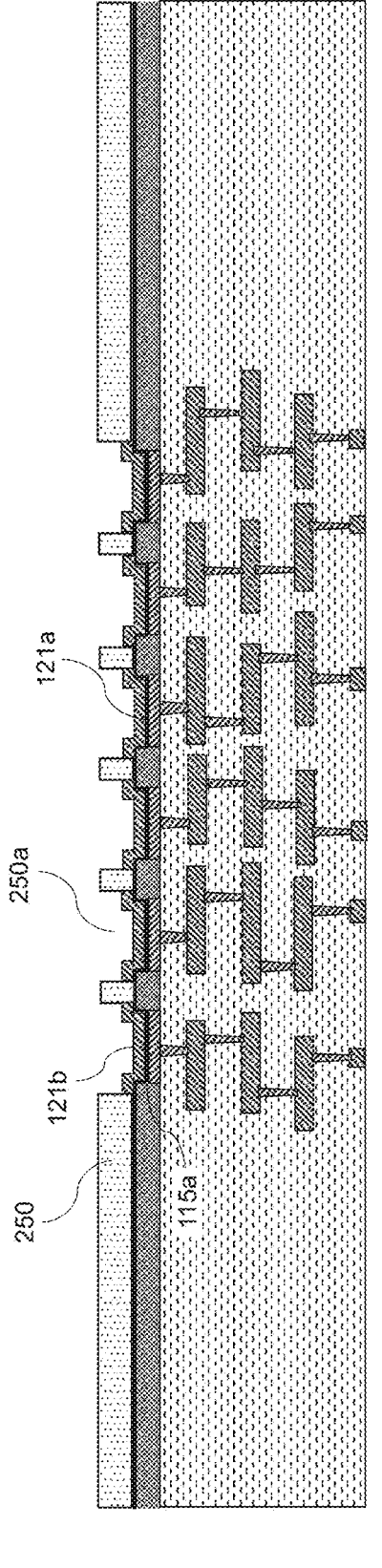
FIG. 2D
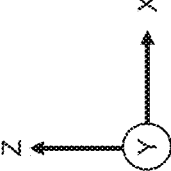

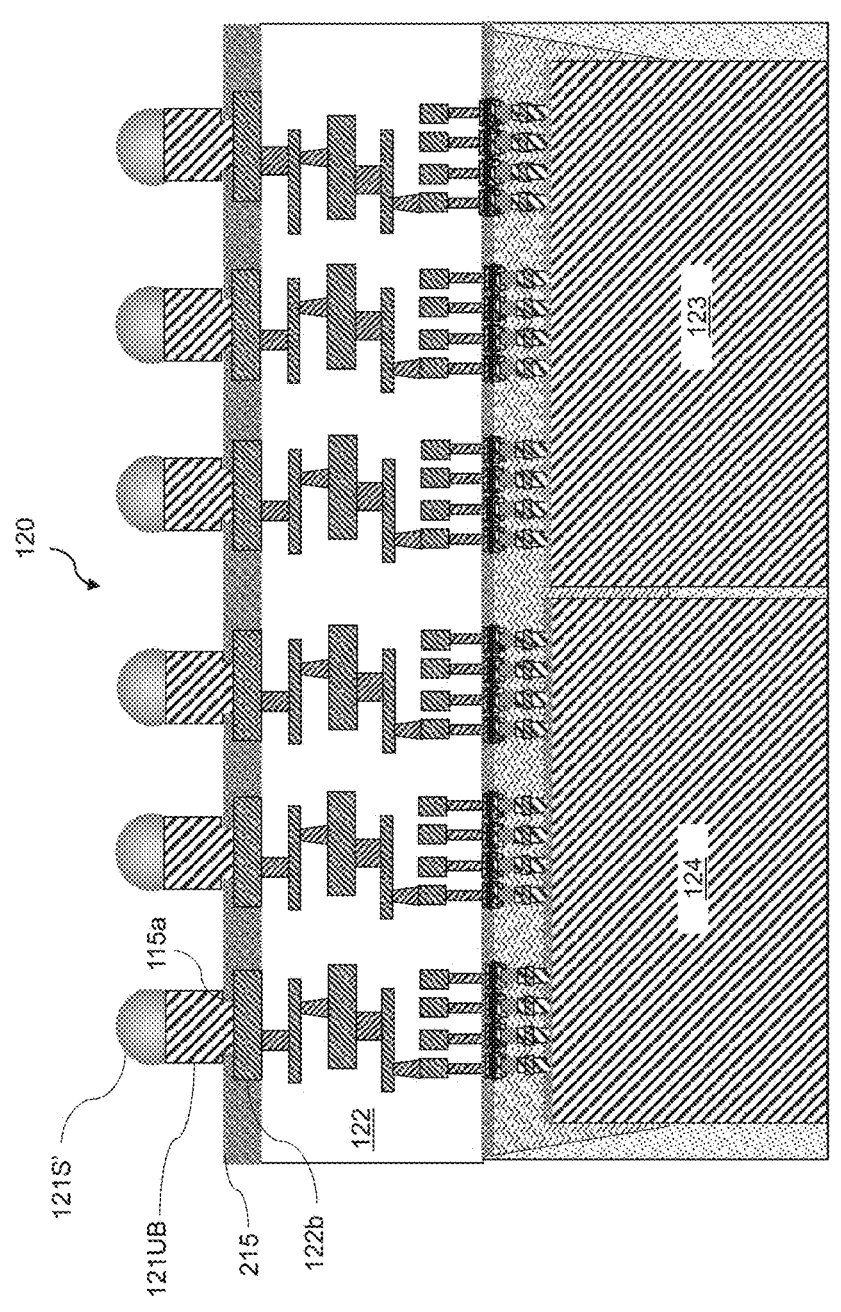
FIG. 2H
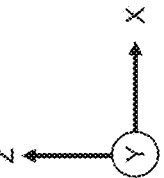

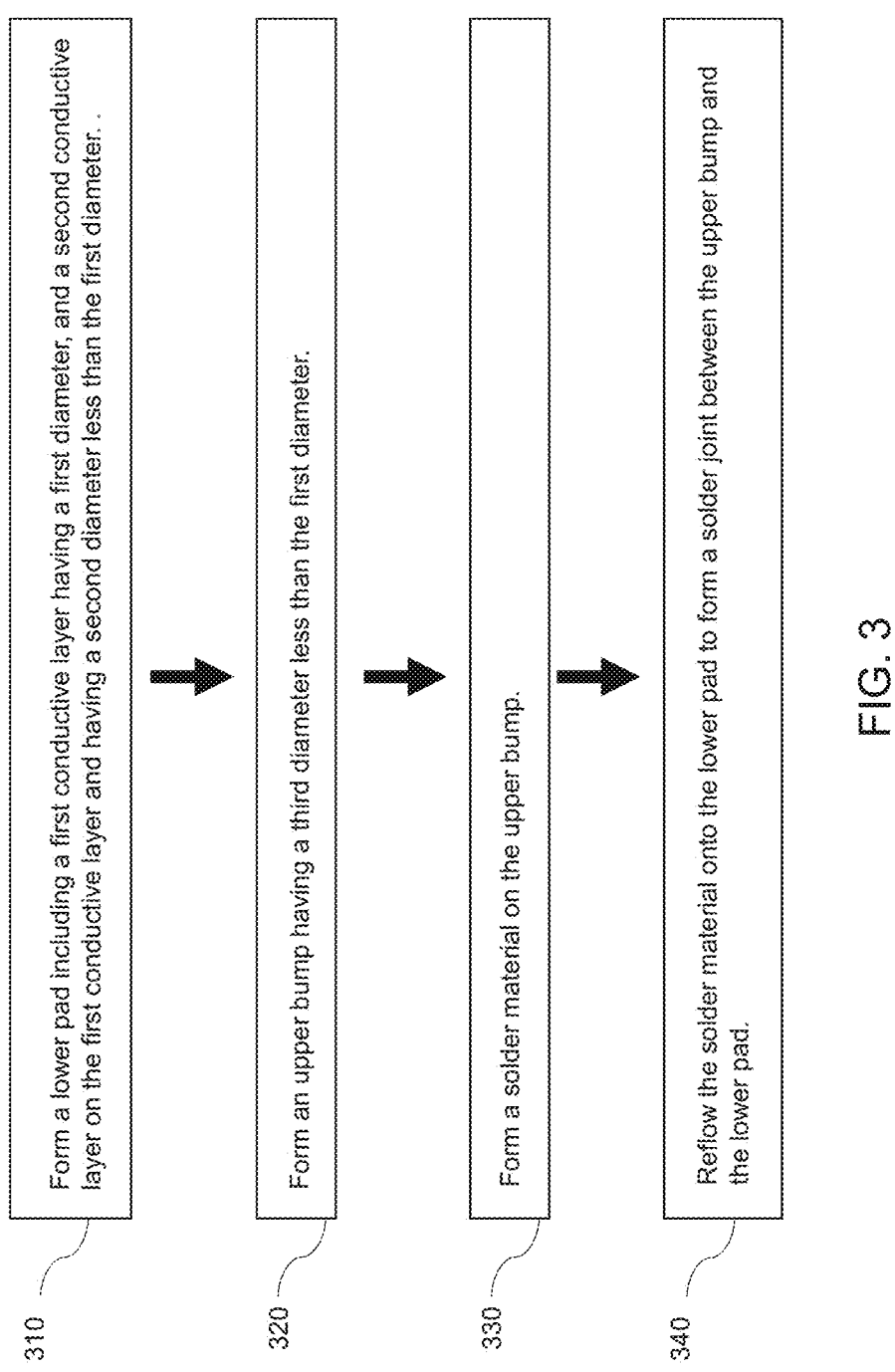

310 Form a lower pad including a first conductive layer having a first diameter, and a second conductive layer on the first conductive layer and having a second diameter less than the first diameter. .

320 Form an upper bump having a third diameter less than the first diameter.

330 Form a solder material on the upper bump.

340 Reflow the solder material onto the lower pad to form a solder joint between the upper bump and the lower pad.

FIG. 3

FINE PITCH CHIP INTERCONNECT STRUCTURE FOR BUMP BRIDGE AND HIGH TEMPERATURE STORAGE IMPROVEMENT AND METHODS FOR FORMING THE SAME

BACKGROUND

A package assembly may include an interposer module mounted on a package substrate. The interposer module may include one or more semiconductor dies connected to an interposer dielectric by interconnect structures (e.g., microbumps). The interposer module may also be connected to the package substrate by interconnect structures (e.g., controlled-collapse chip-connection (C4) interconnect structures).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1C is an axial view (e.g., downward in the Z-direction) of the first interconnect structure according to one or more embodiments.

FIG. 1E is an axial view (e.g., downward in the Z-direction) of the second interconnect structure according to one or more embodiments.

FIG. 2A is a vertical cross-sectional view of an exemplary intermediate structure after forming the package substrate bonding pads on the package substrate, according to one or more embodiments.

FIG. 2B is a vertical cross-sectional view of the exemplary intermediate structure after forming the underbump metallization (UBM) on the package substrate bonding pad, according to one or more embodiments.

FIG. 2D is a vertical cross-sectional view of the exemplary intermediate structure after the formation of the first conductive layer, according to one or more embodiments.

FIG. 2H is a vertical cross-sectional view of the interposer module after the forming of the upper bump (first pillar) according to one or more embodiments.

FIG. 3 is a flow chart illustrating a method of making a package assembly according to one or more embodiments.

DETAILED DESCRIPTION

Figure 1A:
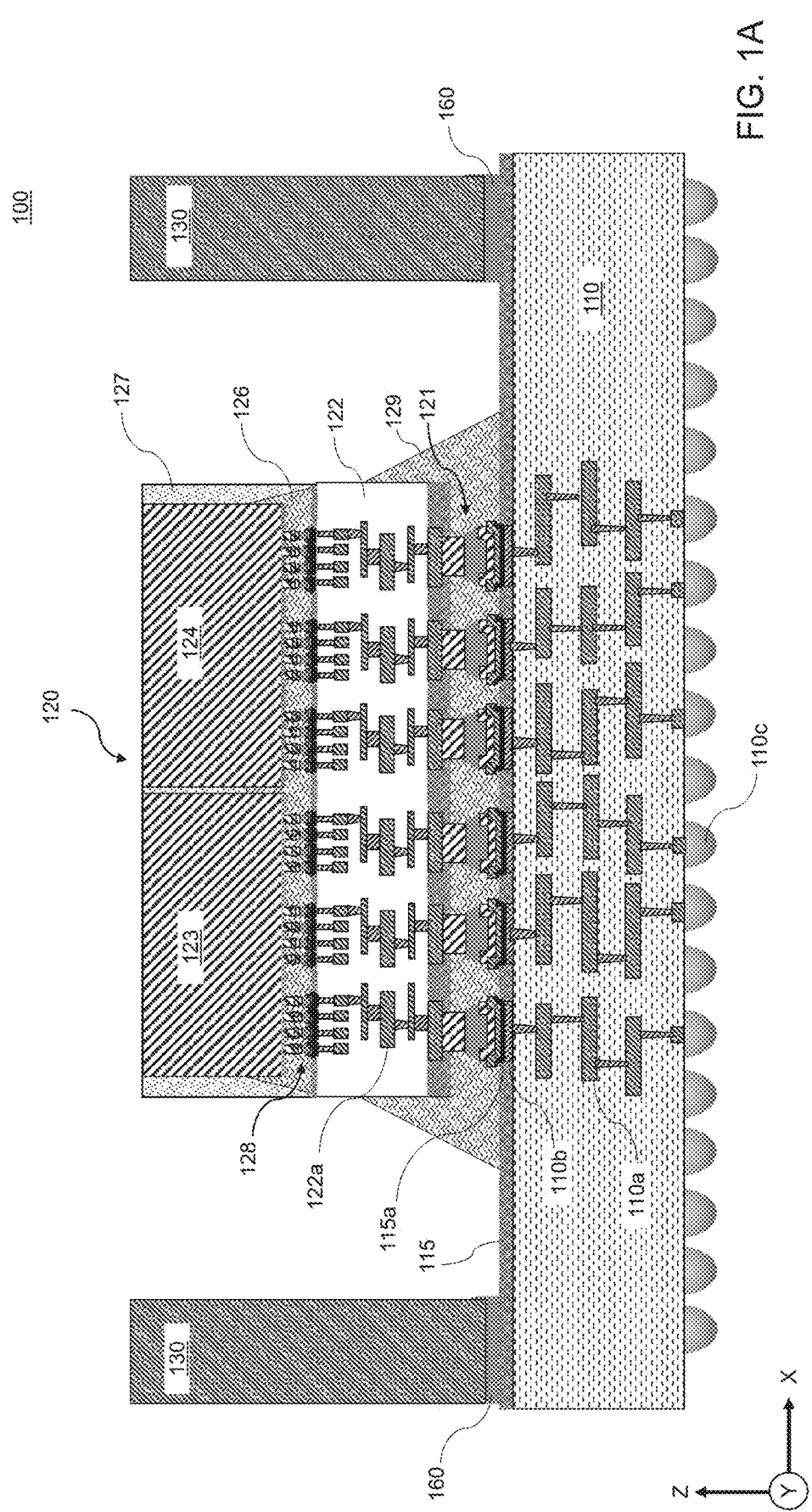
FIG. 1A is a vertical cross-sectional view of a package assembly (e.g., organic/silicon interposer package) according to one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

An interconnect structure (e.g., a microbump connecting a semiconductor die to an interposer, or a C4 bump connecting an interposer to a package substrate) may include a bottom bump and an upper bump. The bottom bump (e.g., on the interposer) may typically include a Cu/Ni/Cu/Sn scheme. However, in instances in which the interconnect structures are closely spaced together, a bump bridge defect may form between adjacent interconnect structures. The bump bridge defect may include a solder bridge that may be formed between solder joints in the adjacent interconnect structures. The bump bridge defects may cause a failure of a reliability test such as a high temperature storage (HTS) test. Thus, the interconnect structures may make it difficult to decrease a pitch (e.g., microbump pitch, distance between center-to-center of microbumps) because a decreased pitch (e.g., fine pitch bump dense area) may cause the bump bridge defects. Another problem with the interconnect structures is that they may be unable to inhibit die slip and shift which often occurs during a connection process (e.g., flip chip bonding process).

However, one or more embodiments of the present disclosure may include an interconnect structure that may be used, for example, as a fine pitch chip interconnect structure. The interconnect structure may, for example, reduce bump bridge defects and improve high temperature storage (HTS) performance. The interconnect structure (e.g., microbump or C4 bump) may utilize a lower pad (e.g., Cu pad/Ni pad structure) instead of a bottom bump. The interconnect structure may be used, for example, in semiconductor devices such as a high-performance computing (HPC) device (e.g., HPC fan-out product). The lower pad may provide a joint window with an increased size as compared to the joint window of the bottom bump. The increased size of the joint window may help to reduce an occurrence of bridge defects (e.g., microbump bridge defects) and help to pass a reliability test such as the HTS test. In particular, the interconnect structure may improve performance in a package assembly (e.g., outsourced semiconductor assembly and test (OSAT)). Another advantage of the interconnect structure is that it may help to inhibit the die slip and shift which often occurs during a connection process.

The upper bump of the interconnect structure may have a critical dimension (CD) that is less than a critical dimension of the lower pad. A ratio of lower pad CD (L2) to upper bump CD (L1) may be in a range between 1 and 3.3 (1<L2/L1<3.3). The interconnect structure may include a microbump scheme of Cu/Ni/Cu/Sn/Cu/Ni, and a C4 bump scheme of Cu/Sn/Cu/Ni. A microbump pitch (P1) may be in a range of greater than zero and not greater than 55 μm (0<P1≤55 μm). A C4 bump pitch (P2) may be in a range of greater than zero and not greater than 220 μm (0<P2≤220 μm).

FIG. 1A is a vertical cross-sectional view of a package assembly 100 (e.g., organic/silicon interposer package) according to one or more embodiments. The package assembly 100 may include a package substrate 110 and an interposer module 120 on the package substrate 110. The interposer module 120 may include a first semiconductor device 123 and a second semiconductor device 124. A package underfill layer 129 may be formed between the interposer module 120 and the package substrate 110. A ring 130 (e.g., metal ring) may be bonded to the package substrate 110 around the interposer module 120.

The package substrate 110 may include any substrate that may support a package assembly. For example, the package substrate 110 may include a system on integrated substrate (SoIS), a printed circuit board (PCB) etc. In one or more embodiments, the package substrate 110 may include a core substrate (e.g., polymer substrate), an upper insulating layer (e.g., chip-side insulating layer) formed on the core substrate, and a lower insulating layer (e.g., board-side insulating layer) formed on the core substrate opposite the upper insulating layer.

The package substrate 110 may include metal interconnects 110*a* (e.g., metal traces and metal vias) to provide an electrical connection of the package substrate 110. The package substrate 110 may also include package substrate bonding pads 110*b* (e.g., package substrate contact pads) formed on a chip-side of the package substrate 110. The package substrate bonding pads 110*b* may be composed of copper or another suitable metal (e.g., silver, chromium, nickel, tin, tungsten, titanium, gold, etc.), a copper alloy, or other suitable metal alloy. The package substrate bonding pads 110*b* may be used to provide an electrical connection to the interposer module 120 or other semiconductor devices (e.g., semiconductor dies) that are mounted on the package substrate 110.

A ball-grid array (BGA) including a plurality of solder balls 110*c* may be formed on a board-side of the package substrate 110. The board-side of the package substrate 110 may be opposite to the chip-side of the package substrate 110. The solder balls 110*c* may allow the package assembly 100 to be securely mounted on a substrate such as a printed circuit board (PCB) and electrically coupled to the substrate. The solder balls 110*c* may be electrically connected to the package substrate bonding pads 110*b* by the metal interconnects 110*a* (e.g., metal traces and metal vias) in the package substrate 110.

The package substrate 110 may include a package substrate upper layer 115 formed on the chip-side surface of the package substrate 110. The package substrate upper layer 115 may include, for example, a passivation layer or an uppermost redistribution layer (RDL) in the package substrate 110. The package substrate upper layer 115 may include, for example, an organic material (e.g., dielectric polymer material) such as polyimide (PI), benzocyclobutene (BCB), or polybenzobisoxazole (PBO). The package substrate upper layer 115 may include package substrate upper layer openings 115*a* to allow connection with the package substrate bonding pads 110*b*. An upper surface of the package substrate bonding pads 110*b* may be exposed through the package substrate upper layer openings 115*a*. The package substrate upper layer openings 115*a* may have a tapered sidewall so that a diameter of the package substrate upper layer openings 115*a* (in the X-Y plane) may decrease in a direction toward the package substrate bonding pad 110*b*.

The package substrate upper layer 115 may alternatively include a solder resist layer (e.g., solder mask). The solder resist layer may include a thin layer of polymer material (e.g., epoxy polymer). The solder resist layer may have a thickness in a range from about 5 μm to 50 μm. Greater or lesser thickness of the solder resist layer may be used. The solder resist layer may be formed so as to cover the package substrate bonding pads 110*b* and other metal features (e.g., conductive lines, copper traces) on the chip-side surface of the package substrate 110. The solder resist layer may protect the package substrate bonding pads 110*b* and other metal features from oxidation. The solder resist layer may also prevent solder bridges (e.g., unintended electrical connections) from forming between closely spaced metal features.

The interposer module 120 may be connected (e.g., electrically connected) to the package substrate 110 by first interconnect structures 121 (e.g., C4 bump structures). The first interconnect structures 121 may connect the interposer module 120 to the package substrate bonding pads 110 through the package substrate upper layer openings 115*a* in the package substrate upper layer 115. The first interconnect structures 121 may include, for example, an upper bump (Cu), solder joint (Sn) and lower pad (Cu/Ni) scheme.

A package underfill layer 129 may be formed under the interposer module 120 and around the first interconnect structures 121 so as to fix the interposer module 120 to the package substrate 110. The package underfill layer 129 may be formed of an epoxy-based polymeric material. Other suitable underfill layer materials are within the contemplated scope of disclosure.

The interposer module 120 may include an interposer dielectric 122 (e.g., interposer) that may be composed of silicon or an organic material (e.g., dielectric polymer material) such as polyimide (PI), benzocyclobutene (BCB), or polybenzobisoxazole (PBO). Other suitable materials are within the contemplated scope of disclosure. The interposer dielectric 122 may include metal interconnects 122*a* (e.g., metal lines and metal vias) that may be electrically connected to the first interconnect structures 121. The interposer dielectric 122 may be composed of a plurality of dielectric layers, and the metal interconnects 122*a* may be formed in the plurality of dielectric layers.

The first semiconductor device 123 and second semiconductor device 124 may be mounted on the interposer dielectric 122. The first semiconductor device 123 and second semiconductor device 124 may be mounted on the interposer dielectric 122 by second interconnect structures 128 (e.g., micro-bump structures) that may be electrically connected to the metal interconnects 122*a*. The second interconnect structures 128 may have a design that is substantially similar to or different than the first interconnect structures 121. The second interconnect structures 128 may include, for example, an upper bump (Cu/Ni/Cu), solder joint (Sn) and lower pad (Cu/Ni) scheme.

Although two semiconductor devices 123, 124 are illustrated in FIG. 1A, the package assembly 100 may include any number of semiconductor devices. In addition, each of the first semiconductor device 123 and second semiconductor device 124 may include, for example, a semiconductor die, a system on chip (SOC) die, a system on integrated chips (SoIC) die, and a high-bandwidth memory (HBM) die. In particular, the interposer module 120 may include a high-performance computing (HPC) application and may include, for example, an integrated graphics processing unit (GPU), application specific integrated circuit (ASIC), field-programmable gate array (FPGA), and HBM by chip on wafer on substrate (CoWoS®) technology or integrated fan-out on substrate (INFO-oS) technology.

An interposer underfill layer 126 may be formed around the second interconnect structures 128 and between the first semiconductor device 123 and the interposer dielectric 122, and between the second semiconductor device 124 and the interposer dielectric 122. The interposer underfill layer 126 may be formed as two separate portions under the first semiconductor device 123 and second semiconductor device 124, respectively. Alternatively, the interposer underfill layer 126 may be formed continuously as one layer under the first semiconductor device 123 and second semiconductor device 124. The interposer underfill layer 126 may also be formed between the first semiconductor device 123 and the second semiconductor device 124. The interposer underfill layer 126 may also be formed of an epoxy-based polymeric material.

A molding material layer 127 may be formed over the first semiconductor device 123, the second semiconductor device 124, the interposer underfill layer 126 and the interposer dielectric 122. The molding material layer 127 may be formed of an epoxy molding compound (EMC).

A ring 130 may be formed around the interposer module 120 (e.g., in the X-Y plane) and may be fixed to the package substrate 110 (e.g., to the package substrate upper layer 115) by an adhesive 160. The adhesive 160 may include, for example, an epoxy adhesive or silicone adhesive. Other adhesive materials are within the contemplated scope of this disclosure. The ring 130 may be formed of a metal such as copper with a nickel coating, an aluminum alloy or stainless steel. Other suitable materials for use as the ring 130 are within the contemplated scope of disclosure. The ring 130 may include, for example, a stiffener ring that may provide rigidity to the package substrate 110.

In an alternative design of the package assembly 100, the ring 130 may be replaced with a package lid (not shown) that may be formed over the interposer module 120 and fixed to the package substrate upper layer 115 by the adhesive 160. In this alternative design, a thermal interface material (TIM) film may be formed on an upper surface of the interposer module 120. The package lid may contact the TIM film and provide a cover for the interposer module 120. The package lid may be formed, for example, of metal, ceramic or polymer material.

Figure 1B:
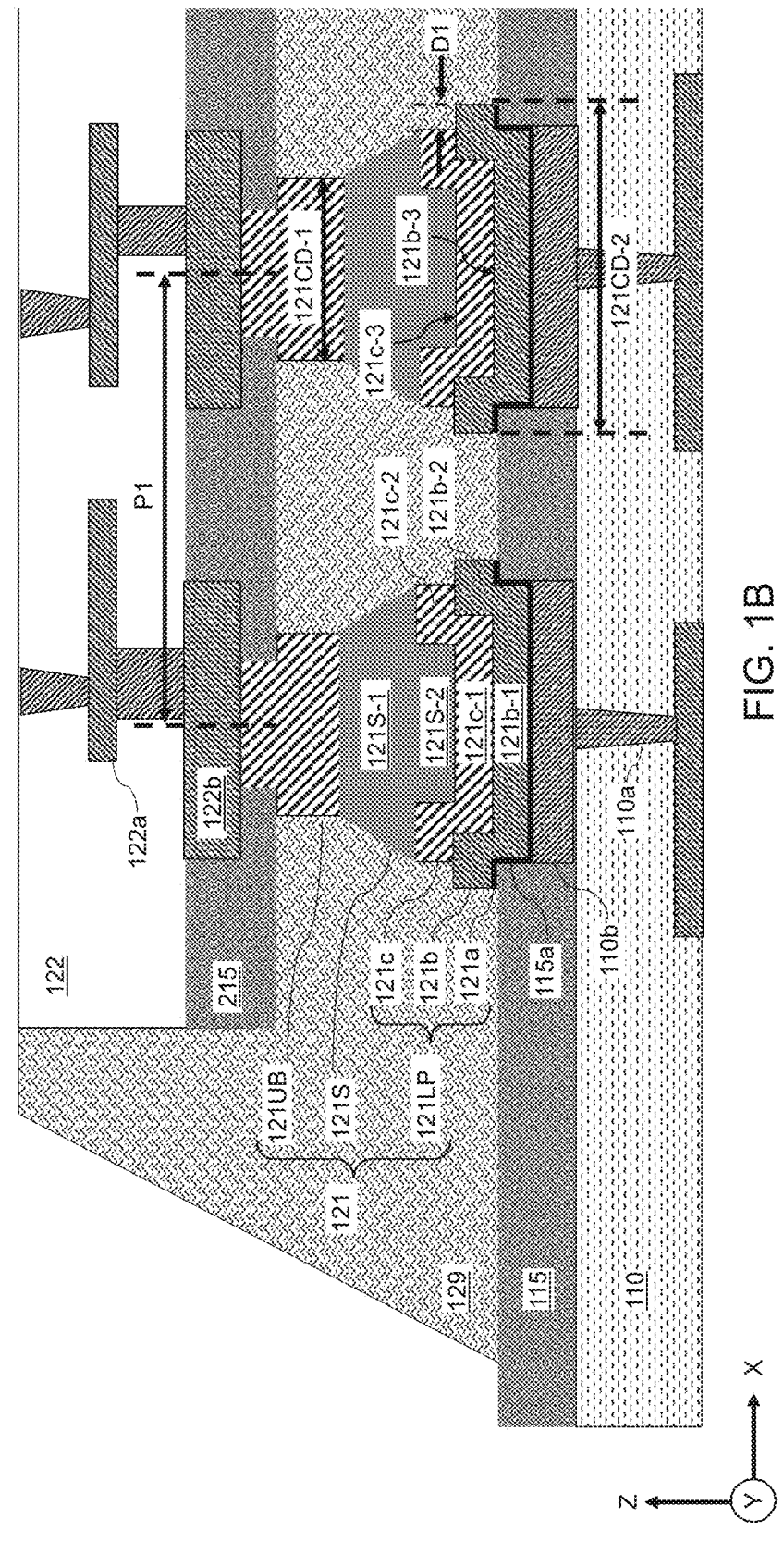
FIG. 1B is a detailed vertical cross-sectional view of the first interconnect structures, according to one or more embodiments.

FIG. 1B is a detailed vertical cross-sectional view of the first interconnect structures 121, according to one or more embodiments. A pitch P1 between the first interconnect structures 121 (e.g., between a center of the first interconnect structures 121 in the X-Y plane) may be, for example, less than or equal to about 220 μm.

As illustrated in FIG. 1B, the first interconnect structure 121 may include a lower pad 121LP, an upper bump 121UB and a solder joint 121S between the upper bump 121UB to the lower pad 121LP. The upper bump 121UB may be fixed to the lower pad 121LP by the solder joint 121S.

The lower pad 121LP may include underbump metallization (UBM) 121*a* that may be formed in the package substrate upper layer opening 115*a*. The UBM 121*a* may be conformally formed in the package substrate upper layer opening 115*a*. The UBM 121*a* may contact an upper surface of the package substrate bonding pad 110*b* through the package substrate upper layer opening 115*a*. The UBM 121*a* may be electrically connected to the metal interconnect 110*a* and, therefore, the solder balls 110*c* (e.g., BGA) by way of the package substrate bonding pad 110*b*.

The UBM 121*a* may include, for example, a diffusion barrier layer and a seed layer. A width (e.g., diameter) of each of the diffusion barrier layer and seed layer may be substantially the same. That is, a width of the UBM 121*a* may be substantially uniform. Further, as illustrated in FIG. 1B, the width of the UBM 121*a* may be greater than the package substrate upper layer opening 115*a* such that a portion of the UBM 121*a* may be formed outside of the package substrate upper layer opening 115*a* and on an upper surface of the package substrate upper layer 115 that surrounds the package substrate upper layer opening 115*a*. The diffusion barrier layer may contact the package substrate bonding pad 110*b* and include, for example, tantalum nitride, titanium nitride, tantalum, titanium, or the like. The seed layer may be formed on the diffusion barrier layer and include, for example, copper, silver, chromium, nickel, tin, gold, and combinations thereof. The seed layer may have a thickness, for example, in a range from 50 nm to 300 nm.

The lower pad 121LP may also include a first conductive layer 121*b* (e.g., barrier layer) on the UBM 121*a*. The first conductive layer 121*b* may be conformally formed on the UBM 121*a*. The first conductive layer 121*b* may include a first conductive layer lower portion 121*b*-1 in the package substrate upper layer opening 115*a*, and a first conductive layer upper portion 121*b*-2 on the first conductive layer lower portion 121*b*-1. The first conductive layer upper portion 121*b*-2 may include a first recess 121*b*-3 that may be concentrically formed with the package substrate upper layer opening 115a and/or with the package substrate bonding pad 110b. The first conductive layer upper portion 121b-2 may also have an outer diameter 121CD-2 (first diameter) that is greater than a diameter of the first conductive layer lower portion 121b-1. Thus, an outer portion of the first conductive layer upper portion 121b-2 may be formed on the upper surface of the package substrate upper layer 115. The outer diameter 121CD-2 may constitute a critical dimension of the lower pad 121LP. The critical dimension may depend on a design of the package assembly 100 (e.g., based on a number of interconnect input/output (I/O) counts).

The first conductive layer 121b (e.g., the first conductive layer lower portion 121b-1 and first conductive layer upper portion 121b-2) may be composed of nickel and have a thickness greater than 3 μm. Other suitable metals for the first conductive layer 121b are within the contemplated scope of disclosure.

The lower pad 121LP may also include a second conductive layer 121c on the first conductive layer 121b. The second conductive layer 121c may be conformally formed on the first conductive layer 121b. The second conductive layer 121c may include a second conductive layer lower portion 121c-1 in the package substrate upper layer opening 115a. The second conductive layer 121c may also include a second conductive layer upper portion 121c-2 on the second conductive layer lower portion 121c-1. The second conductive layer upper portion 121c-2 may include a second recess 121c-3 that may be concentrically formed with the first recess 121b-3 and/or with the package substrate upper layer opening 115a and/or with the package substrate bonding pad 110b.

The second conductive layer upper portion 121c-2 may also have an outer diameter (second diameter) that is greater than a diameter of the second conductive layer lower portion 121c-1. Thus, an outer portion of the second conductive layer upper portion 121c-2 may be formed on an upper surface of the first conductive layer upper portion 121b-2. In at least one embodiment, the outer diameter of the second conductive layer upper portion 121c-2 (second diameter) may constitute a critical dimension and be greater than 50 μm and less than 150 μm.

The outer diameter of the second conductive layer upper portion 121c-2 (second diameter) may also be less than the outer diameter of the first conductive layer upper portion 121b-2 (first diameter). As a result, the second conductive layer upper portion 121c-2 and the first conductive layer upper portion 121b-2 may have a step configuration as illustrated in FIG. 1B. In at least one embodiment, a first distance D1 between an outer wall of the second conductive layer upper portion 121c-2 and an outer wall of the first conductive layer upper portion 121b-2 may be in a range from 0.5 μm to 5 μm.

The step configuration may be helpful for reducing a risk of solder bridge defect. The step configuration may also enlarge a bump joint window when assembly alloy temperature is too high or the dwell time is too long. During a reflow process, the step configuration may also cause the solder material to stop on the upper surface of the first conductive layer upper portion 121b-2 and a form a Cu—Ni—Sn intermetallic compound (IMC) and thereby avoid a fine pitch interconnect electrical fail issue.

Further, the second recess 121c-3 in the second conductive layer upper portion 121c-2 may have a diameter that is in a range from 40% to 70% of the outer diameter of the second conductive layer upper portion 121c-2 (second diameter). A depth of the second recess 121c-3 may be, for example, greater than 0.2 μm. The second recess 121c-3 may help to inhibit die slip and shift during a connection process (e.g., connecting the interposer module 120 to the package substrate 110).

The second conductive layer 121c (e.g., the second conductive layer lower portion 121c-1 and second conductive layer upper portion 121c-2) may be composed of copper and have a thickness that is less than a thickness of the first conductive layer 121b. Other suitable metals for the second conductive layer 121c are within the contemplated scope of disclosure. In at least one embodiment, the thickness of the second conductive layer 121c may be less than about 120 μm.

Referring again to FIG. 1B, the upper bump 121UB may be formed on the board-side of the interposer dielectric 122. The upper bump 121UB may include a first pillar that may include copper (e.g., a copper post). The first pillar may contact an interposer lower bonding pad 122b that may be exposed through openings in the interposer dielectric lower layer 215 (e.g., passivation layer, solder resist layer, etc.) on the board-side of the interposer dielectric 122. The interposer lower bonding pad 122b may be connected to the metal interconnects 122a in the interposer dielectric 122.

The upper bump 121UB (first pillar) may contact the interposer lower bonding pad 122b through a UBM (not shown). The UBM may have a structure that is similar to the UBM 121a, and include a diffusion barrier layer and a seed layer. The upper bump 121UB (first pillar) (e.g., copper post) may be formed on the seed layer and have a pillar shape (e.g., a circular cylindrical shape, square cylindrical shape, etc.). The upper bump 121UB (first pillar) may include a first pillar material. The first pillar material may include, for example, pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. In at least one embodiment, the upper bump (first pillar) may have a tapered sidewall such that a diameter of the upper bump 121UB may increase in a direction toward the interposer lower bonding pad 122b.

The outer diameter 121CD-1 of the upper bump 121UB (first pillar) (third diameter) may be less than the outer diameter of the first conductive layer upper portion 121b-2 (first diameter). The outer diameter 121CD-1 may constitute a critical dimension of the upper bump 121UB. In at least one embodiment, the outer diameter 121CD-1 may be greater than 50 μm and less than 150 μm. The critical dimension may depend on a design of the package assembly 100 (e.g., based on a number of interconnect input/output (I/O) counts). A thickness of the upper bump 121UB (first pillar) in the Z-direction (e.g., from the interposer lower bonding pad 122b) may be, for example, less than about 120 μm.

The solder joint 121S may be formed between the lower pad 121LP and the upper bump 121UB. The solder joint 121S may include a solder material that is different, for example, than a standard solder material (e.g., different than SAC304 or SAC405). The solder material may include a lead-free solder material. The solder material may include tin and another element such as silver, indium, antimony, bismuth, zinc, etc. The solder material may have a melting point in a range from 90° C. to 450° C., and more particularly, in a range from about 220° C. to 260° C. The solder joint 121S may be formed, for example, by a reflow process (e.g., reflow soldering process) in which a solder material layer is formed (e.g., by an electroplating process) on the upper bump 121UB, the upper bump 121UB is closely positioned over lower pad 121LP, and the solder material is reflowed (e.g., softened) onto the lower pad 121LP at a temperature in the melting point range for the solder material (e.g., about 220° C. to 260° C.) to form the solder joint 121S.

The solder joint 121S may have a configuration as illustrated in FIG. 1B. The solder joint 121S may have a main body 121S-1 connected to the upper bump 121UB (first pillar). The main body 121S-1 may extend from the upper bump 121UB (first pillar) to an upper surface of the second conductive layer upper portion 121c-2. The main body 121S-1 may have an outer diameter at the upper bump 121UB (first pillar) that is substantially the same as the outer diameter of the upper bump 121UB (first pillar). The main body 121S-1 may have an outer diameter at the second conductive layer upper portion 121c-2 that is substantially the same as the outer diameter of the second conductive layer upper portion 121c-2. That is, the main body 121S-1 may have a tapered sidewall formed around an outer circumference of the main body 121S-1 and extending from the upper bump 121UB (first pillar) to the second conductive layer upper portion 121c-2.

The solder joint 121S may also include an extension portion 121S-2 that extends from the main body 121S-1 into the second recess 121c-3 of the second conductive layer upper portion 121c-2. The extension portion 121S-2 may be conformally formed around an entirety of the second recess 121c-3. Thus, the extension portion 121S-2 may have a shape that is substantially the same as a shape of the second recess 121c-3. Thus, a length of the extension portion 121S-2 in the Z-direction may be greater than 0.2 μm, and a diameter of the extension portion 121S-2 may be in a range from 40% to 70% of the outer diameter of the main body 121S-1 (at the second conductive layer upper portion 121c-2). The extension portion 121S-2 may provide an interlocking arrangement between the solder joint 121S and the second conductive layer 121c. The interlocking arrangement may help to inhibit die slip and ship.

A thickness of the solder joint 121S from the bottom surface of the upper bump 121UB (first pillar) to the bottom of the second recess 121c-3, may be based on a thickness of the upper bump 121UB (first pillar). For example, the thickness of the solder joint 121S may be in a range from about 1.5 to 2.5 times the thickness of the upper bump 121UB (first pillar). In at least one embodiment, the thickness of the solder joint 121S may be about twice the thickness of the upper bump 121UB (first pillar).

FIG. 1C is an axial view (e.g., downward in the Z-direction) of the first interconnect structure 121 according to one or more embodiments. The various parts of the first interconnect structure 121 may have a substantially circular outer shape. Other outer shapes of the various parts of the first interconnect structure 121 are within the contemplated scope of disclosure. For examples, squares, ovals or other polygon outer shapes may be within the contemplated scope of disclosure. The various parts of the first interconnect structure 121 may also be concentrically arranged. As illustrated in FIG. 1C, the first interconnect structure 121 in order of increasing outer diameter may include the extension portion 121S-2 of the solder joint 121S, the upper bump 121UB (first pillar), the second conductive layer lower portion 121c-1, the second conductive layer upper portion 121c-2, the first conductive layer lower portion 121b-1, and the first conductive layer upper portion 121b-2.

Figure 1D:
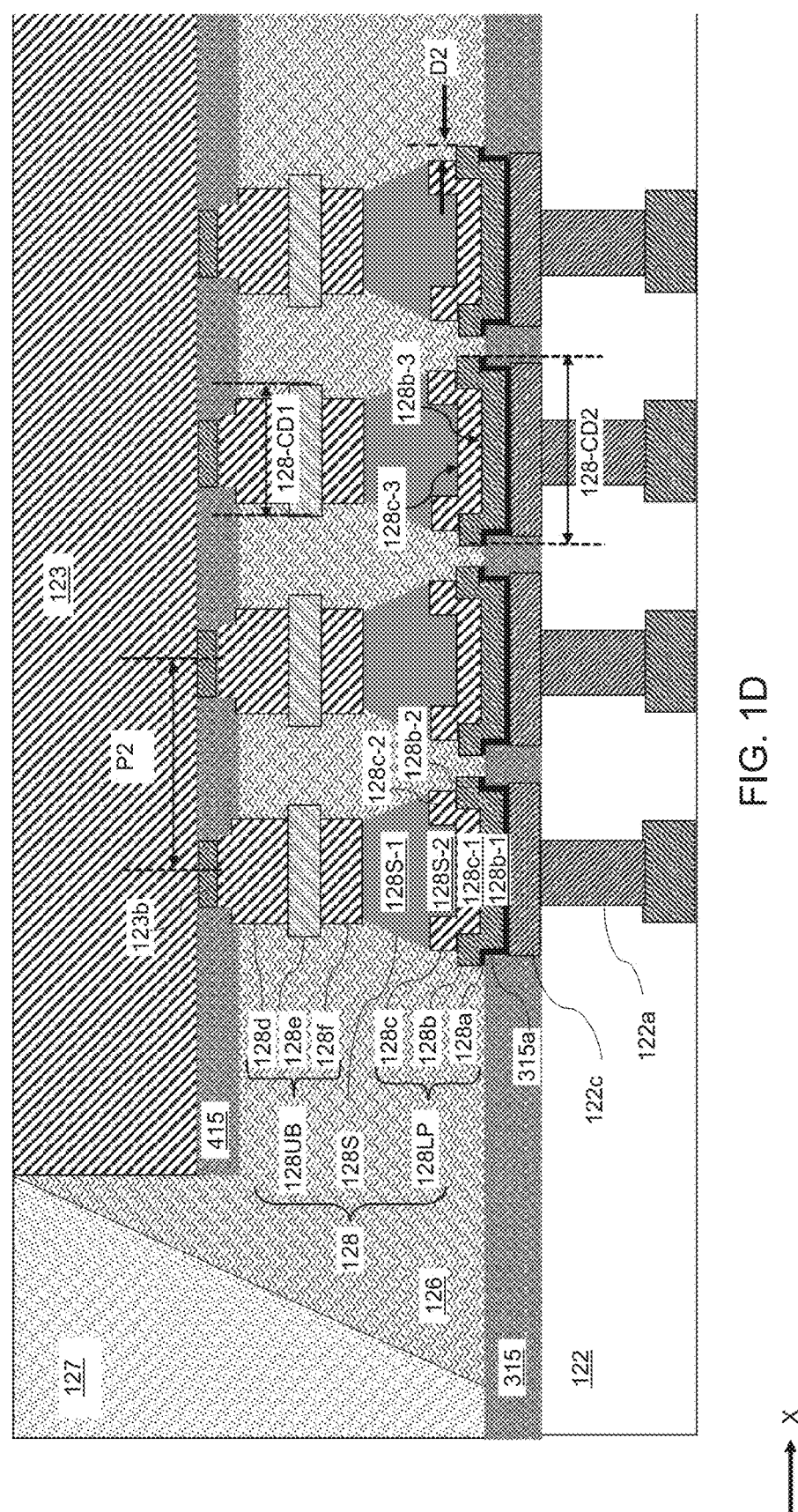
FIG. 1D is a detailed vertical cross-sectional view of the second interconnect structures (e.g., microbumps), according to one or more embodiments.

FIG. 1D is a detailed vertical cross-sectional view of the second interconnect structures 128 (e.g., microbumps), according to one or more embodiments. The second interconnect structures 128 may have a design that is substantially similar to the design of the first interconnect structures 121. Thus, the discussion above with respect to the first interconnect structures 121 is incorporated herein and should be understood to apply generally to the interconnect structures 128 unless otherwise stated.

The second interconnect structures 128 may connect the first semiconductor device 123 and the second semiconductor device 124 (see FIG. 1A) to interposer dielectric 122. A size of the interconnect structures 128 may be significantly less than a size of the interconnect structures 121. As illustrated in FIG. 1D, a pitch P2 between the second interconnect structures 128 (e.g., between a center of the second interconnect structures 128 in the X-Y plane) may be, for example, less than or equal to about 55 μm. The second interconnect structure 128 may include a lower pad 128-LP, an upper bump 128UB and a solder joint 128S between the upper bump 128-UP to the lower pad 128-LP. The upper bump 128UB may be fixed to the lower pad 128-LP by the solder joint 128S.

The interposer dielectric 122 may include an interposer dielectric upper layer 315 on a chip-side surface of the interposer dielectric 122. The interposer dielectric upper layer 315 may include, for example, a passivation layer, an uppermost redistribution layer (RDL) (e.g., dielectric layer) in the interposer dielectric 122, or a solder resist layer. The interposer dielectric upper layer 315 may include one or more interposer dielectric upper layer openings 315a. The interposer dielectric 122 may include one or more interposer upper bonding pads 122c having an upper surface that may be exposed through the interposer dielectric upper layer openings 315a.

The lower pad 128-LP may include underbump metallization (UBM) 128a that may be formed in the interposer dielectric upper layer opening 315a. The UBM 128a may contact an upper surface of the interposer upper bonding pad 122c through the interposer dielectric upper layer opening 315a. The UBM 128a may include, for example, a diffusion barrier layer and a seed layer.

The lower pad 128-LP may also include a first conductive layer 128b on the UBM 128a. The first conductive layer 128b may include a first conductive layer lower portion 128b-1 in the interposer dielectric upper layer opening 315a, and a first conductive layer upper portion 128b-2 on the first conductive layer lower portion 128b-1. The first conductive layer upper portion 128b-2 may include a first recess 128b-3.

The first conductive layer upper portion 128b-2 may also have an outer diameter 128-CD2 (first diameter) that is greater than a diameter of the first conductive layer lower portion 128b-1. Thus, an outer portion of the first conductive layer upper portion 128b-2 may be formed on the upper surface of the interposer dielectric upper layer 315. The outer diameter 128-CD2 may constitute a critical dimension of the lower pad 128-LP. In at least one embodiment, the outer diameter 128-CD2 of the first conductive layer upper portion 128b-2 may be less than about 40 μm. In at least one embodiment, the first conductive layer 128b may have a thickness greater than about 3 μm.

The lower pad 128-LP may also include a second conductive layer 128c on the first conductive layer 128b. The second conductive layer 128c may include a second conductive layer lower portion 128c-1 in the interposer dielectric upper layer opening 315a. The second conductive layer 128c may also include a second conductive layer upper portion 128c-2 on the second conductive layer lower portion 128c-1. The second conductive layer upper portion 128c-2 may include a second recess 128c-3.

The second conductive layer upper portion 128c-2 may have an outer diameter (second diameter) that is greater than a diameter of the second conductive layer lower portion 128c-1. Thus, an outer portion of the second conductive layer upper portion 128c-2 may be formed on an upper surface of the first conductive layer upper portion 128b-2. In at least one embodiment, the outer diameter of the first conductive layer upper portion 128c-2 may be less than about 40 μm.

The outer diameter of the second conductive layer upper portion 128c-2 (second diameter) may also be less than the outer diameter of the first conductive layer upper portion 128b-2 (first diameter). As a result, the second conductive layer upper portion 128c-2 and the first conductive layer upper portion 128b-2 may have a step configuration as illustrated in FIG. 1D. In at least one embodiment, a second distance D2 between an outer wall of the second conductive layer upper portion 128c-2 and an outer wall of the first conductive layer upper portion 128b-2 may be in a range from 0.5 μm to 5 μm. The second distance D2 may be substantially equal to or less than the first distance D1.

The second recess 128c-3 in the second conductive layer upper portion 128c-2 may have a diameter that is in a range from 40% to 70% of the outer diameter of the second conductive layer upper portion 128c-2 (second diameter). A depth of the second recess 128c-3 may be, for example, greater than 0.2 μm. The second recess 128c-3 may help to inhibit die slip and shift during the connection process of connecting the first semiconductor device 123 and second semiconductor device 124 (see FIG. 1A) to the interposer dielectric 122. In at least one embodiment, a thickness of the second conductive layer 128c may be in a range from 1 μm to 10 μm.

Referring again to FIG. 1D, the upper bump 128UB may be formed on the board-side of the first semiconductor device 123 and second semiconductor device 124 (see FIG. 1A). A semiconductor device lower layer 415 (e.g., passivation layer, solder resist layer, etc.) may be formed on the board-side of the first semiconductor device 123. The upper bump 128UB may include a first pillar 128d that may include copper (e.g., a copper post). The first pillar 128d may contact a semiconductor device lower bonding pad 123b that may be exposed through an opening in the semiconductor device lower layer 415. The first pillar 128d may contact the semiconductor device lower bonding pad 123b through a UBM (not shown).

The first pillar 128d may include a first pillar material. The first pillar material may include, for example, pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. Other metal materials for the first pillar 128d are within the contemplated scope of disclosure. In at least one embodiment, a thickness of the first pillar 128d may be in a range from about 1 μm to about 10 μm. In at least one embodiment, an outer diameter of the first pillar 128d may be less than about 40 μm. In at least one embodiment, the first pillar 128d may have a tapered sidewall such that a diameter of the first pillar 128d may increase in a direction toward the semiconductor device lower bonding pad 123b.

The upper bump 128UB may also include a second pillar 128e on the first pillar 128d and include a second pillar material that is different than the first pillar material in the first pillar 128d. In at least one embodiment, the second pillar material may include nickel. Other metal materials for the second pillar 128e are within the contemplated scope of disclosure. The second pillar 128e may have a thickness in the Z-direction that is less than a thickness of the first pillar 128d. In at least one embodiment, the thickness of the second pillar 128e may be greater than about 3 μm.

The second pillar 128e may have an outer diameter 128-CD1 (third diameter) that is greater than a diameter of the first pillar 128d. The outer diameter 128-CD1 of the second pillar 128e (third diameter) may be less than the outer diameter of the first conductive layer upper portion 128b-2 (first diameter). The outer diameter 128-CD1 may constitute a critical dimension of the upper bump 128UB. In at least one embodiment, the outer diameter of the second pillar 128e may be less than about 40 μm.

It should be noted here that the ubump scheme including the upper bump 128UB may be different than the C4 bump scheme including the upper bump 121UB. In particular, the upper bump 128UB may include the second pillar 128e which may not necessarily be included in the upper bump 121UB. For an advanced package interconnect, the ubump may be very sensitive for a reliability analysis (RA) torture test. Thus, the upper bump 128UB may include the second pillar (e.g., nickel layer) as a barrier layer to prevent a tin diffusion-induced open fail issue.

The upper bump 128UB may also include a third pillar 128f on the second pillar 128e. The third pillar 128f may include the first pillar material that is in the first pillar 128d. The third pillar 128f may also have a thickness in the Z-direction that is less than a thickness of the first pillar 128d. In at least one embodiment, the thickness of the third pillar 128f may be in a range from about 1 μm to about 10 μm. A total combined thickness of the first pillar 128d, second pillar 128e and third pillar 128f in the Z-direction (e.g., from the interposer lower bonding pad 122b) may be, for example, in a range from about 3 μm to 50 μm.

The third pillar 128f may have an outer diameter that is substantially the same as the outer diameter of the first pillar 128d, and less than the outer diameter 128-CD1 (third diameter) of the second pillar 128e. In at least one embodiment, the outer diameter of the third pillar 128f may be less than about 40 μm.

The solder joint 128S may be formed between the lower pad 128-LP and the upper bump 128UB. The solder joint 128S may have a main body 128S-1 connected to the third pillar 128f of the upper bump 128UB. The main body 128S-1 may extend from the third pillar 128f to an upper surface of the second conductive layer upper portion 128c-2. The main body 128S-1 may have an outer diameter at the third pillar 128f that is substantially the same as the outer diameter of the third pillar 128f. The main body 128S-1 may have an outer diameter at the second conductive layer upper portion 128c-2 that is substantially the same as the outer diameter of the second conductive layer upper portion 128c-2.

The solder joint 128S may also include an extension portion 128S-2 that extends from the main body 128S-1 into the second recess 128c-3 of the second conductive layer upper portion 128c-2. A length of the extension portion 128S-2 in the Z-direction may be greater than 0.2 μm, and a diameter of the extension portion 128S-2 may be in a range from 40% to 70% of the outer diameter of the main body 128S-1 (at the second conductive layer upper portion 128c-2).

A thickness of the solder joint 128S (e.g., from the bottom surface of the third pillar 128f to the bottom of the second recess 121c-3) may be based on a combined thickness of the first pillar 128*d* and the third pillar 128*f*. For example, the thickness of the solder joint 128S may be in a range from about 1.5 to 2.5 times the combined thickness of the first pillar 128*d* and the third pillar 128*f*. In at least one embodiment, the thickness of the solder joint 128S may be about twice the combined thickness of the first pillar 128*d* and the third pillar 128*f*.

FIG. 1E is an axial view (e.g., downward in the Z-direction) of the second interconnect structure 128 according to one or more embodiments. The various parts of the second interconnect structure 128 may have a substantially circular outer shape. Other outer shapes of the various parts of the second interconnect structure 128 are within the contemplated scope of disclosure. The various parts of the second interconnect structure 128 may also be concentrically arranged. As illustrated in FIG. 1E, the second interconnect structure 128 in order of increasing outer diameter may include the extension portion 128S-2 of the solder joint 128S, the first pillar 128*d* and second pillar 128*f* of the upper bump 128UB, the second conductive layer lower portion 128*c*-1, the second conductive layer upper portion 128*c*-2, the first conductive layer lower portion 128*b*-1, and the first conductive layer upper portion 128*b*-2.

FIGS. 2A-2F illustrate a method of forming the package assembly 100, according to one or more embodiments.

FIG. 2A is a vertical cross-sectional view of an exemplary intermediate structure after forming the package substrate bonding pads 110*b* on the package substrate 110, according to one or more embodiments. The package substrate bonding pads 110*b* may be formed on the chip side of the package substrate 110. The package substrate bonding pads 110*b* may be formed, for example, by first depositing a metal layer on a surface of the package substrate 110. The metal layer may include copper or another suitable metal (e.g., silver, chromium, nickel, tin, tungsten, titanium, gold, etc.), a copper alloy, or other suitable metal alloy. Other suitable metal materials are within the contemplated scope of disclosure. The metal layer may be deposited, for example, by a suitable deposition process such as physical vapor deposition, chemical vapor deposition, sputtering, etc. The metal layer may then be etched to form the package substrate bonding pads 110*b*. The metal layer may be etched, for example, by using a photolithographic process. The photolithographic process may include forming a patterned photoresist mask (not shown) on the metal layer, and etching (e.g., wet etching, dry etching, etc.) the exposed upper surface of the metal layer through openings in the photoresist mask. The photoresist mask may be subsequently removed by ashing, dissolving the photoresist mask or by consuming the photoresist mask during the etch process.

The package substrate upper layer 115 (e.g., passivation layer, RDL layer (e.g., dielectric layer), resist layer, etc.) may then be formed by a suitable deposition process such as physical vapor deposition, chemical vapor deposition, sputtering, etc. The package substrate upper layer 115 may be etched to form the package substrate upper layer openings 115*a* so as to expose an upper surface of the package substrate bonding pads 110*b*. The package substrate upper layer 115 may be etched, for example, by using a photolithographic process. The photolithographic process may include forming a patterned photoresist mask (not shown) on the package substrate upper layer 115, and etching (e.g., wet etching, dry etching, etc.) the exposed upper surface of the package substrate upper layer 115 through openings in the photoresist mask. The photoresist mask may be subsequently removed by ashing, dissolving the photoresist mask or by consuming the photoresist mask during the etch process.

FIG. 2B is a vertical cross-sectional view of the exemplary intermediate structure after forming the UBM 121*a* on the package substrate bonding pad 110*b*, according to one or more embodiments. The UBM 121*a* may be formed by first depositing (e.g., by physical vapor deposition (PVD) or sputtering) a first material (e.g., Ti) for the diffusion barrier layer on the package substrate upper layer 115. The first material may contact a surface of the package substrate bonding pads 110*b* through the package substrate upper layer openings 115*a*. Then, a second material (e.g., copper or copper alloy) for the seed layer may then be deposited (e.g., by physical vapor deposition (PVD) or sputtering) on the first material for the diffusion barrier layer.

The first material (e.g., Ti) and second material (e.g., copper or copper alloy) may then be etched simultaneously to form the diffusion barrier layer and seed layer in and around the package substrate upper layer openings 115*a*. The etching may be performed, for example, by using a photolithographic process. The photolithographic process may include forming a patterned photoresist mask (not shown) on the seed layer, and etching (e.g., wet etching, dry etching, etc.) the exposed portions of the seed layer and diffusion barrier layer through openings in the photoresist mask. The photoresist mask may be subsequently removed by ashing, dissolving the photoresist mask or by consuming the photoresist mask during the etch process.

Figure 2C:
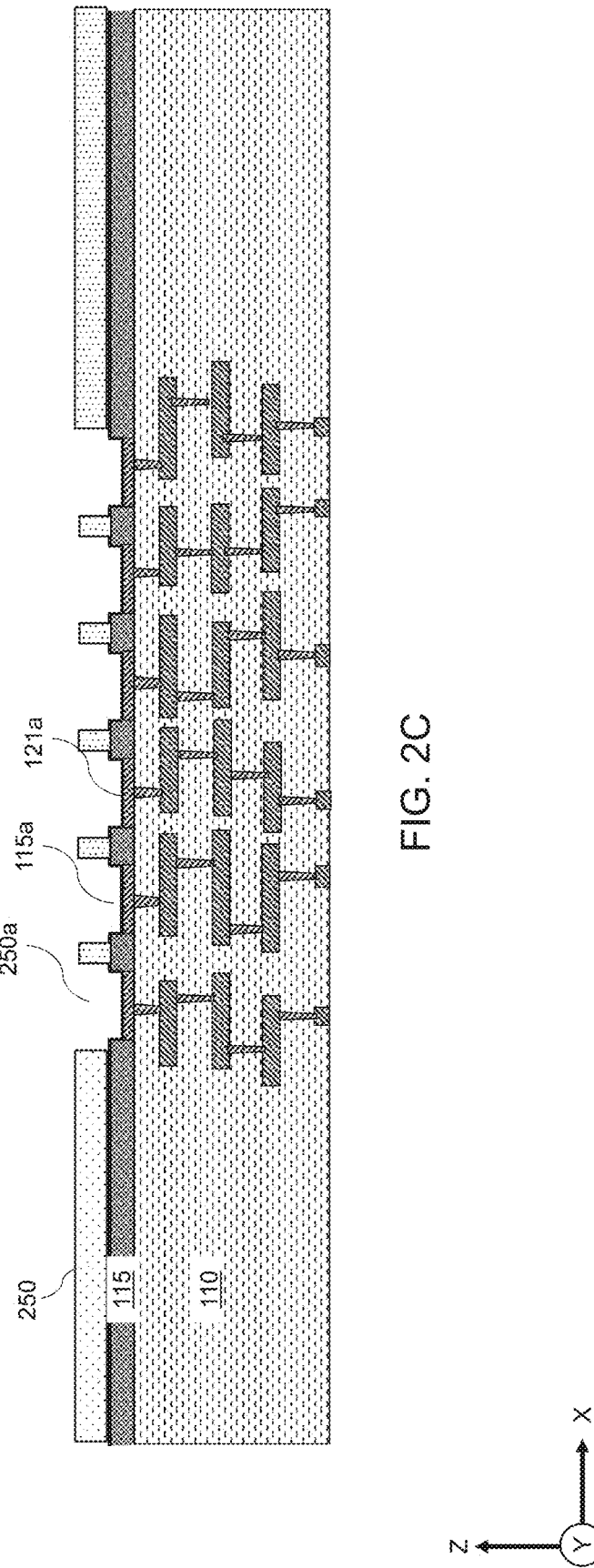
FIG. 2C is a vertical cross-sectional view of the exemplary intermediate structure after the formation of a patterned photoresist layer, according to one or more embodiments.

FIG. 2C is a vertical cross-sectional view of the exemplary intermediate structure after the formation of a patterned photoresist layer 250, according to one or more embodiments. A layer of photoresist material may be deposited on the package substrate 110 by a suitable deposition process such as physical vapor deposition, chemical vapor deposition, sputtering, etc. The patterned photoresist layer 250 may be formed by etching the layer of photoresist material to form photoresist layer openings 250*a*. The etching may expose the UBM 121*a* in package substrate upper layer openings 115*a* and on an area around the package substrate upper layer openings 115*a*.

The layer of photoresist material may be etched, for example, by using a photolithographic process. The photolithographic process may include forming a patterned photoresist mask (not shown) on the layer of photoresist material, and etching (e.g., wet etching, dry etching, etc.) the exposed upper surface of the photoresist material through openings in the photoresist mask. The photoresist mask may be subsequently removed by ashing, dissolving the photoresist mask or by consuming the photoresist mask during the etch process.

FIG. 2D is a vertical cross-sectional view of the exemplary intermediate structure after the formation of the first conductive layer 121*b*, according to one or more embodiments. The first conductive layer 121*b* may be formed on the UBM 121*a* through the photoresist layer openings 250*a* and the package substrate upper layer openings 115*a*. The first conductive layer 121*b* may be formed, for example, by sputtering, printing, electroplating, electroless plating, and commonly used chemical vapor deposition (CVD) methods (with patterning by a photolithography). In at least one embodiment, an electro-chemical plating (ECP) may be carried out to form the first conductive layer 121*b* (e.g., nickel layer) having a thickness that is greater than 3 μm.

Figure 2E:
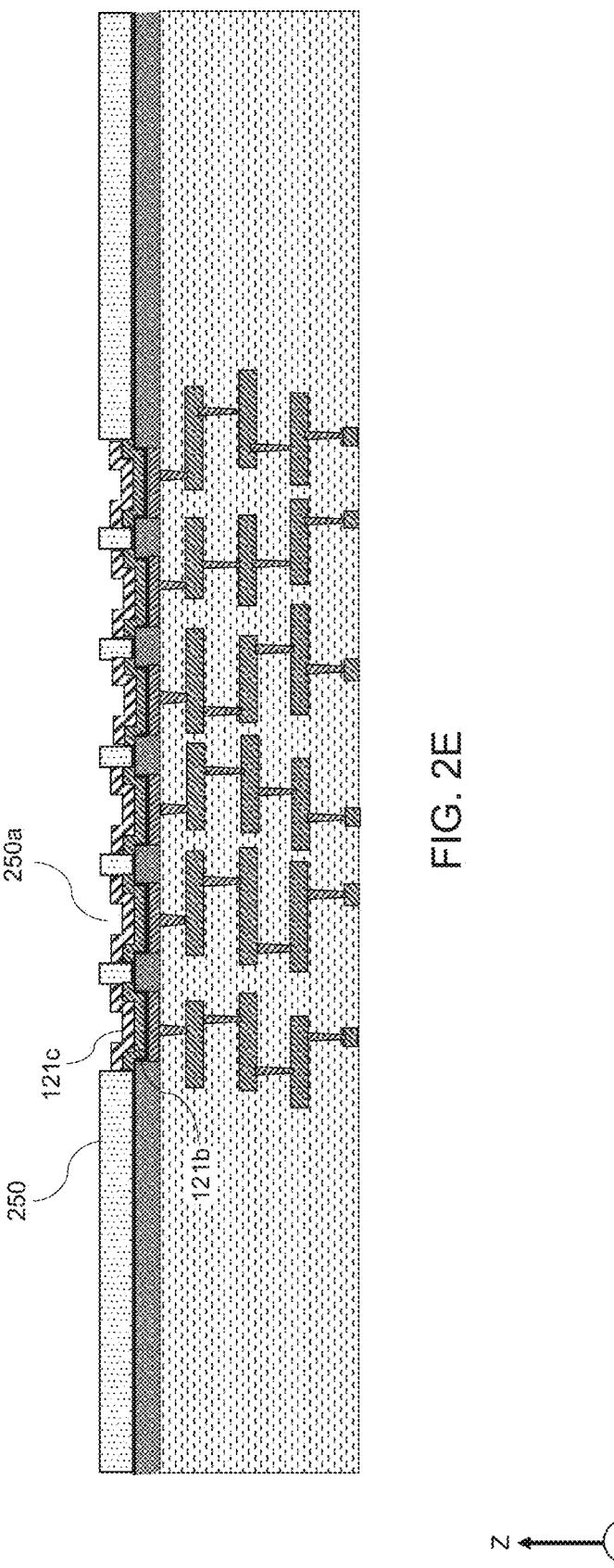
FIG. 2E is a vertical cross-sectional view of the exemplary intermediate structure after the formation of the second conductive layer, according to one or more embodiments.

FIG. 2E is a vertical cross-sectional view of the exemplary intermediate structure after the formation of the second conductive layer 121*c*, according to one or more embodiments. The second conductive layer 121c may be formed on the first conductive layer 121b through the photoresist layer openings 250a. The second conductive layer 121c may be formed, for example, by sputtering, printing, electroplating, electroless plating, and commonly used chemical vapor deposition (CVD) methods (with patterning by a photolithography). In at least one embodiment, an electro-chemical plating (ECP) may be carried out to form the second conductive layer 121c (e.g., copper layer) having a thickness that is in a range from 1 μm to 3 μm.

Figure 2F:
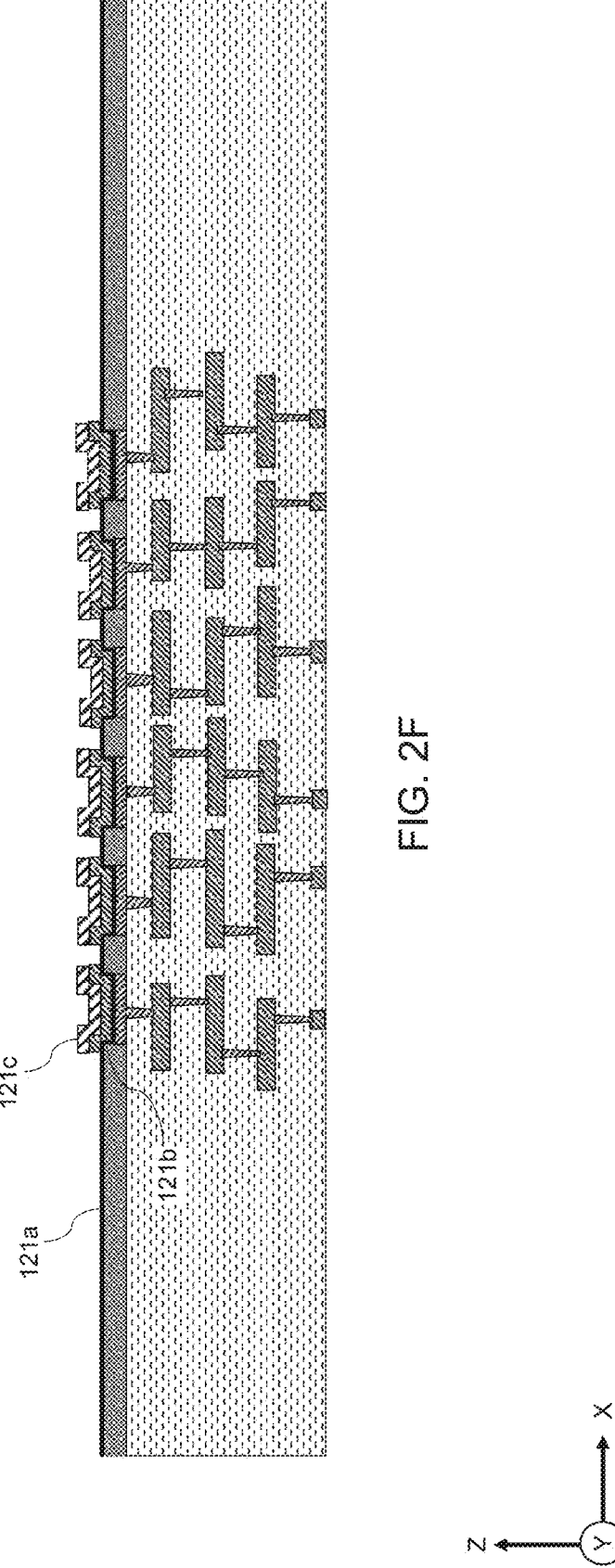
FIG. 2F is a vertical cross-sectional view of the exemplary intermediate structure after the removal (e.g., stripping) of the patterned photoresist layer according to one or more embodiments.

FIG. 2F is a vertical cross-sectional view of the exemplary intermediate structure after the removal (e.g., stripping) of the patterned photoresist layer 250 according to one or more embodiments. The patterned photoresist layer 250 may be removed, for example, by organic stripping, inorganic stripping or dry stripping. In one or more embodiments, the patterned photoresist layer 250 may be dissolved using a solvent (e.g., dimethyl sulfoxide (DMSO), methylene chloride, 1-methyl-2-pyrrolidone (NMP), etc.). As illustrated in FIG. 2F, the removal of the patterned photoresist layer 250 may expose a sidewall of the first conductive layer 121b and a sidewall of the second conductive layer 121c, and the upper surface of the UBM 121a.

Figure 2G:
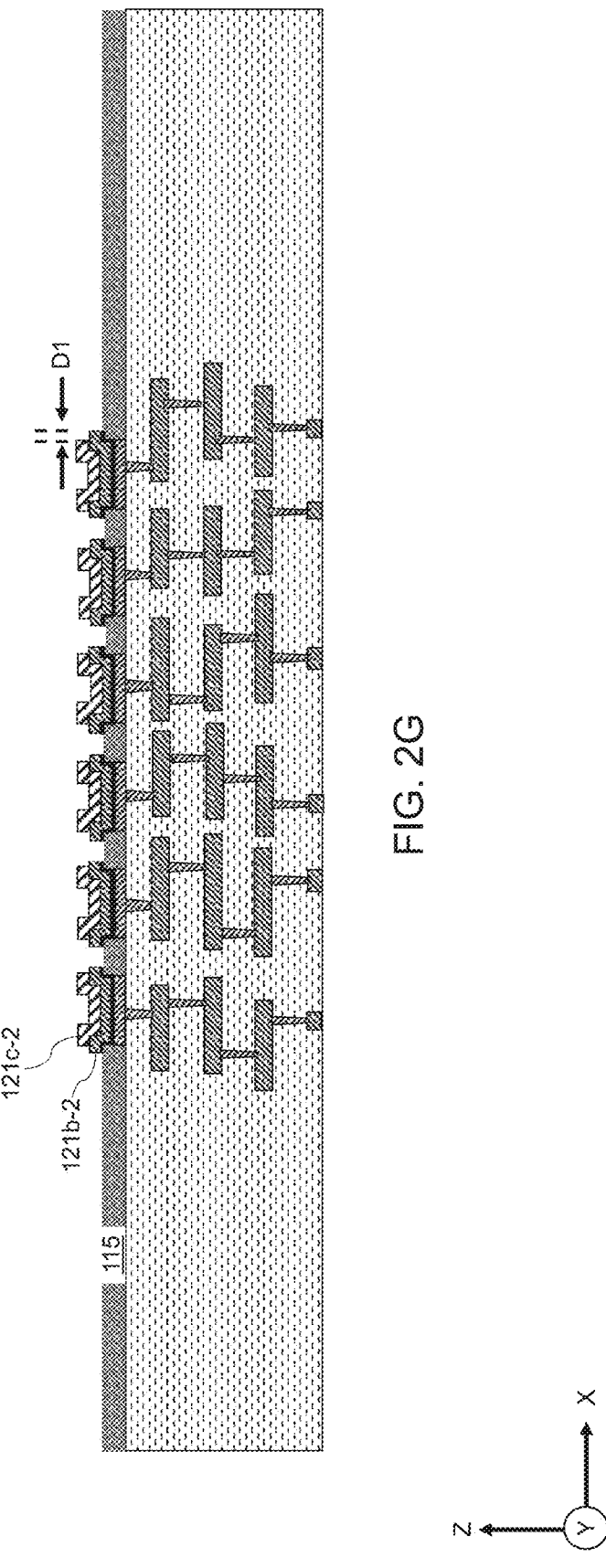
FIG. 2G is a vertical cross-sectional view of the exemplary intermediate structure after the etching of the UBM according to one or more embodiments.

FIG. 2G is a vertical cross-sectional view of the exemplary intermediate structure after the etching of the UBM 121a according to one or more embodiments. The etching may be performed, for example, by using a photolithographic process. The photolithographic process may include forming a patterned photoresist mask (not shown) on the UBM 121a (e.g., the seed layer of the UBM 121a), and etching (e.g., wet etching, dry etching, etc.) the exposed portions of the UBM 121a through openings in the photoresist mask. The photoresist mask may be subsequently removed by ashing, dissolving the photoresist mask or by consuming the photoresist mask during the etch process.

The etching of the UBM 121a may expose the upper surface of the package substrate upper layer 115. The etching of the UBM 121a may also etch away a portion of the sidewall of the second conductive layer 121c so as the form the step configuration. In the step configuration, the outer wall of the second conductive layer upper portion 121c-2 may be separated by the first distance D1 from an outer wall of the first conductive layer upper portion 121b-2.

FIG. 2H is a vertical cross-sectional view of the interposer module 120 after the forming of the upper bump 121UB (first pillar) according to one or more embodiments. As illustrated in FIG. 2H, the interposer module 120 may be inverted so that the board-side of the interposer dielectric 122 is on top. Openings may be formed (e.g., by a photolithographic process) in the interposer dielectric lower layer 215. A UBM layer (e.g., diffusion barrier layer and seed layer) (not shown) may optionally be formed on the interposer lower bonding pads 122b through the openings in the interposer dielectric lower layer 215.

The upper bump 121UB may then be formed on the interposer lower bonding pads 122b through the openings in the interposer dielectric lower layer 215. The upper bump 121UB may be formed, for example, by sputtering, printing, electroplating, electroless plating, and commonly used chemical vapor deposition (CVD) methods (with patterning by a photolithography). In at least one embodiment, an electro-chemical plating (ECP) may be carried out to form the upper bump 121UB.

A solder material layer 121S' may then be formed on the upper bump 121UB. The solder material layer 121S' may be formed on the upper bump 121UB by electrochemical plating (ECP). The solder material layer 121S' will become the solder joint 121S and, therefore, may be composed of the materials described above with respect to the solder joint 121S.

Figure 2I:
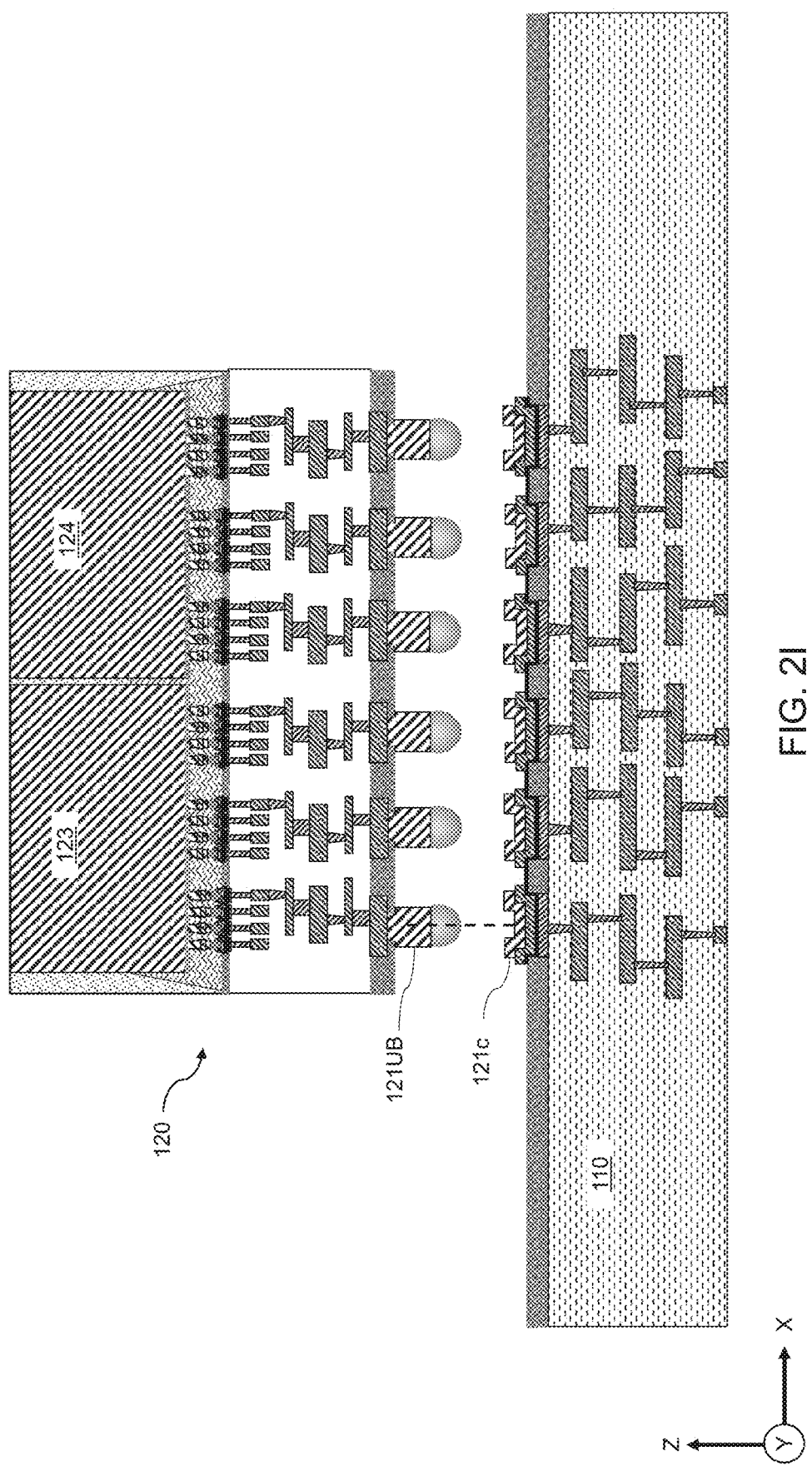
FIG. 2I is a vertical cross-sectional view of the interposer module positioned over the package substrate according to one or more embodiments.

FIG. 2I is a vertical cross-sectional view of the interposer module 120 positioned over the package substrate 110 according to one or more embodiments. As illustrated in FIG. 2I, the interposer module 120 may be positioned closely over the package substrate 110. In particular, a center of the upper bump 121UB may be substantially aligned with a center of the second conductive layer 121c of the lower pad 121LP).

Figure 2J:
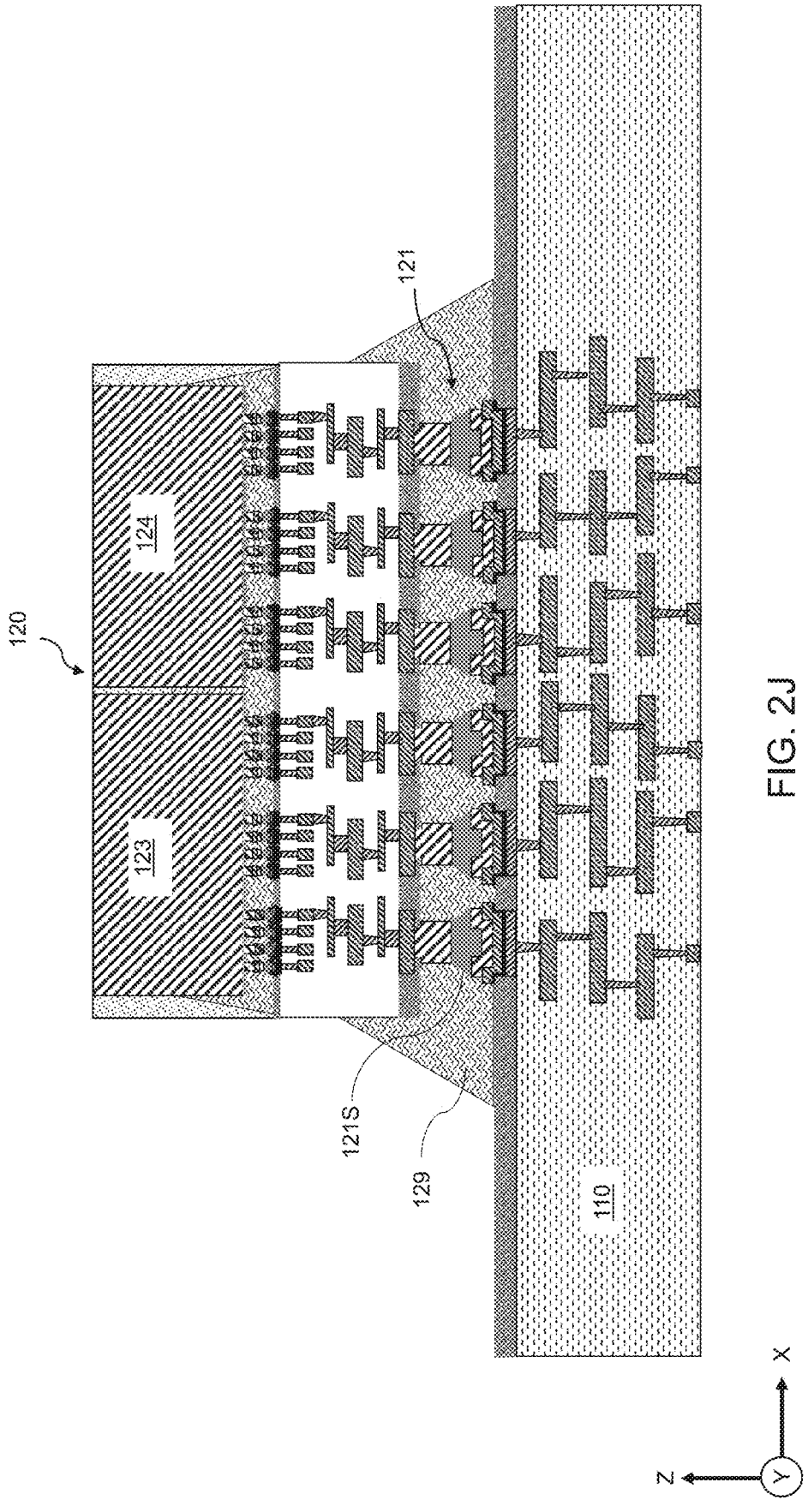
FIG. 2J is a vertical cross-sectional view of the exemplary intermediate structure after the forming of the solder joint according to one or more embodiments.

FIG. 2J is a vertical cross-sectional view of the exemplary intermediate structure after the forming of the solder joint 121S according to one or more embodiments. The solder joint 121S may be formed, for example, by a reflow process (e.g., reflow soldering process) in which the solder material layer 121S' that has been formed (e.g., by an electroplating process) on the upper bump 121UB is closely positioned over the lower pad 121LP, and the solder material layer 121S' is reflowed (e.g., softened) at a temperature in the melting point range for the solder material (e.g., about 220° C. to 260° C.) to form the solder joint 121S. The solder material layer 121S' may be reflowed onto a surface of the second conductive layer 121c. In particular, the solder material layer 121S' may be reflowed into the second recess 121c-3 in the second conductive layer 121c.

After the solder joint 121S is formed and at least substantially rigid, the package underfill layer 129 may be formed between the interposer module 120 and the package substrate 110. The package underfill layer 129 may be formed of an epoxy-based polymeric material. As illustrated in FIG. 2J, the package underfill layer 129 may be formed under the interposer module 120 and around the first interconnect structures 121 so as to fix the interposer module 120 to the package substrate 110. The package underfill layer 129 may then be cured, for example, in a box oven for about 90 minutes at about 150° C. to provide the package underfill layer 129 with a sufficient stiffness and mechanical strength.

Figure 2K:
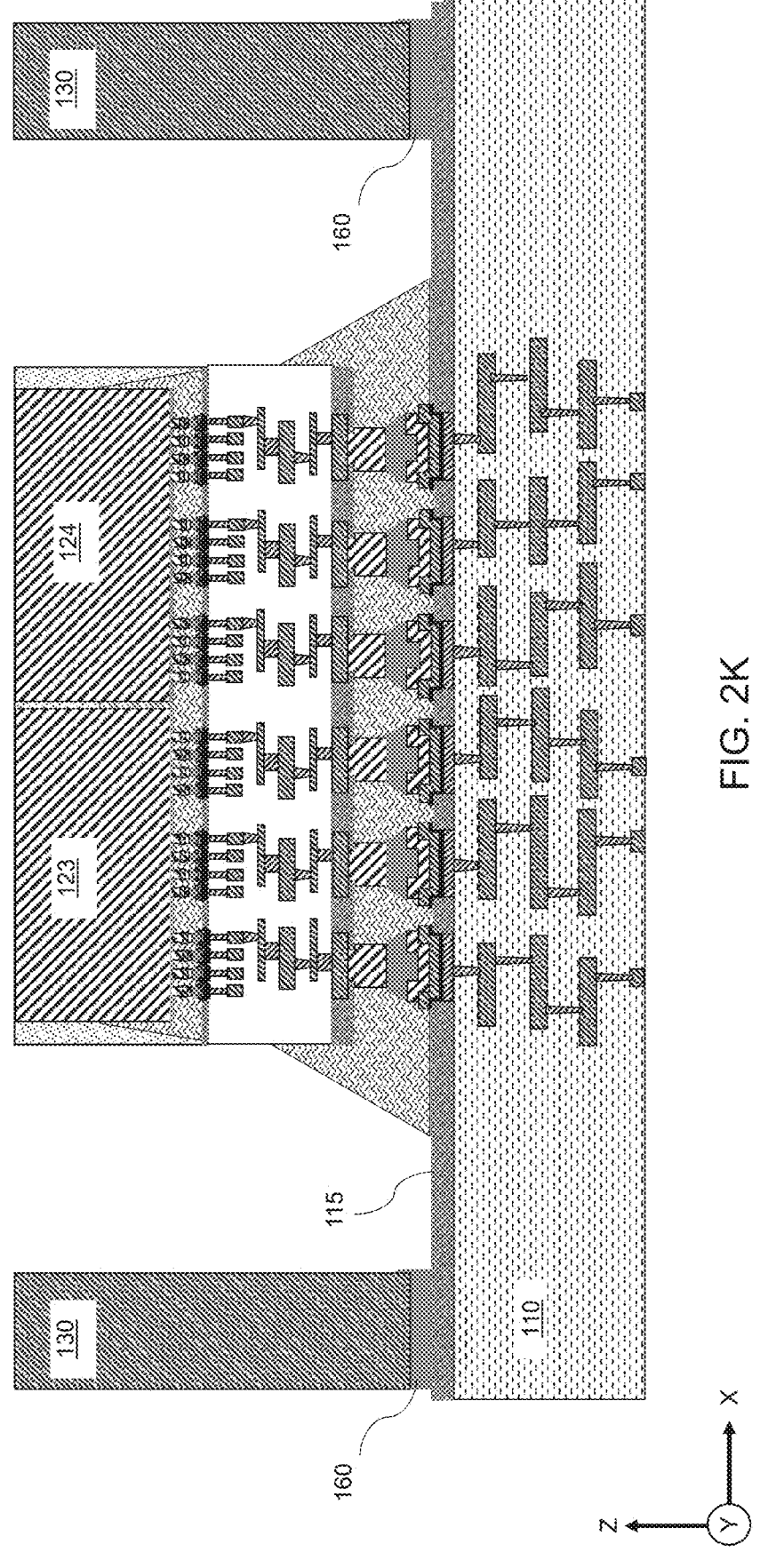
FIG. 2K is a vertical cross-sectional view of the exemplary intermediate structure after forming the ring on the package substrate, according to one or more embodiments.

FIG. 2K is a vertical cross-sectional view of the exemplary intermediate structure after forming the ring 130 on the package substrate 110, according to one or more embodiments. The adhesive 160 may be applied to the package substrate upper layer 115 at a position corresponding to a placement of the ring 130, and in a quantity sufficient to securely bond the ring 130 to the package substrate 110. In particular, a bead of the adhesive 160 may be formed continuously around the interposer module 120 in a shape and location corresponding to a shape and location of the ring 130. The ring 130 (e.g., metal ring) may then be pushed down onto the bead of adhesive 160 around the interposer module 120.

The adhesive 160 may then be cured so as to securely fix the ring 130 to the package substrate 110. The ring 130 may be clamped to the package substrate 110 for a period to allow the adhesive 160 to cure and form a secure bond between the package substrate 110 and the ring 130. The clamping of the ring 130 to the package substrate 110 may be performed, for example, by using a heat clamp module. The heat clamp module may apply a uniform force across the ring 130.

Figure 2L:
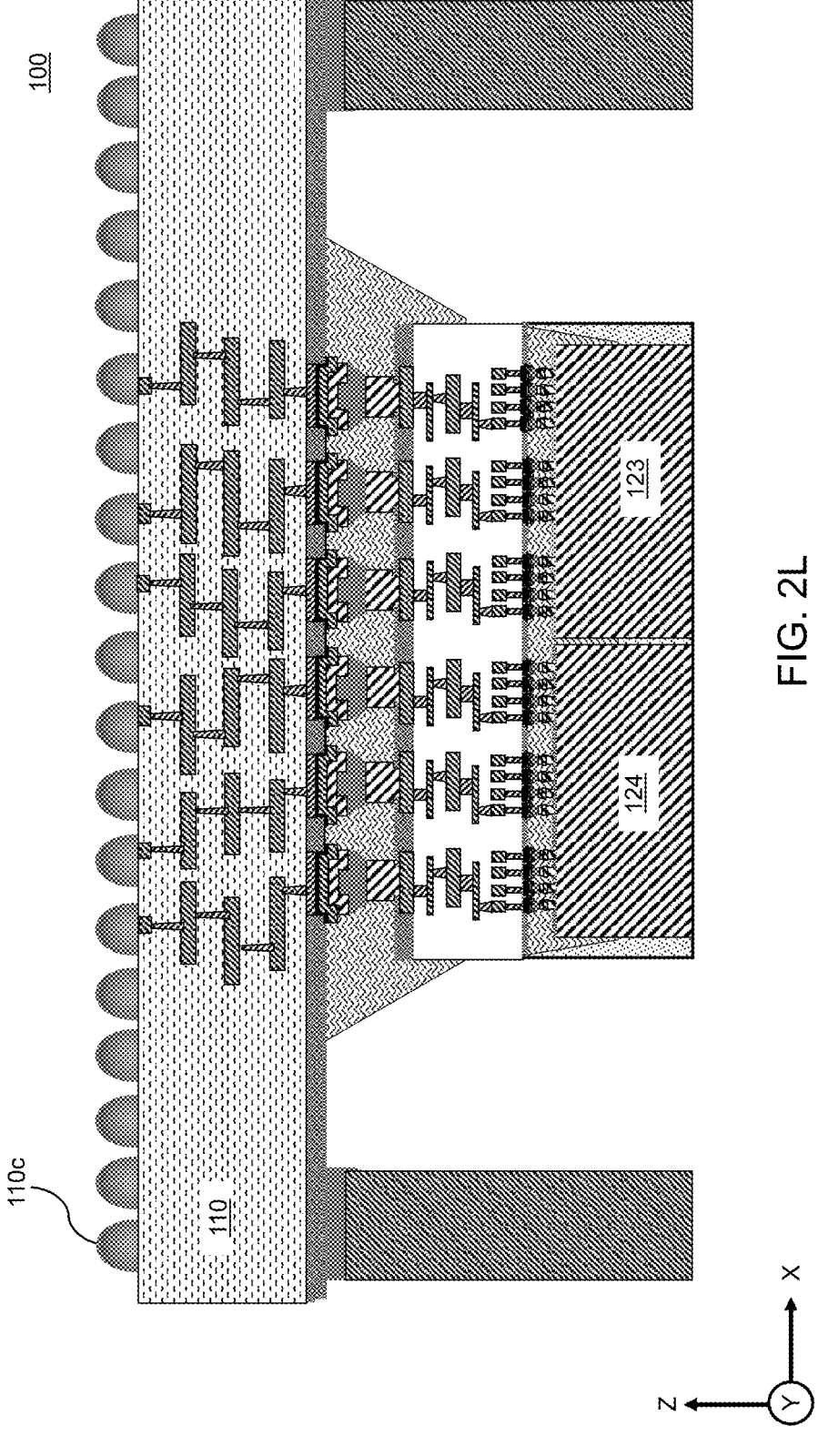
FIG. 2L is a vertical cross-sectional view of the package assembly after the forming of the plurality of solder balls on the package substrate according to one or more embodiments.

FIG. 2L is a vertical cross-sectional view of the package assembly 100 after the forming of the plurality of solder balls 110c on the package substrate 110 according to one or more embodiments. The plurality of solder balls 110c may constitute a ball-grid array (BGA) that may allow the package assembly 100 to be securely mounted (e.g., by surface mount technology (SMT)) on a substrate such as a printed circuit board and electrically coupled to the substrate.

It should be noted that the interconnect structures 128 (e.g., microbumps) may be formed in the interposer module 120 by a method that is substantially similar to the method described above for interconnect structures 121 and illustrated in FIGS. 2A-2L. Thus, for example, referring to FIG. 1D, the lower pad 128LP (e.g., first conductive layer 128*b*-1 and second conductive layer 128*b*-2) may be formed on the interposer upper bonding pads 122*c* through the interposer dielectric upper layer openings 315*a*. The upper bump 128UB may be formed on the semiconductor lower bonding pads 123*b* through openings in the semiconductor device lower layer 415.

The forming of the upper bump 128UB may include forming the first pillar 128*d* including a first pillar material (e.g., copper) (e.g., by an electro-chemical plating process) on the semiconductor lower bonding pads 123*b*. The forming of the upper bump 128UB may also include forming the second pillar 128*e* (e.g., by an electro-chemical plating process) on the first pillar 128. The second pillar 128*e* may including a second pillar material (e.g., nickel) different than the first pillar material. The third pillar 128*f* may then be formed on the second pillar 128*e*. The third pillar 128*f* may include a third pillar material that is different than the second pillar material. In one or more embodiments, third pillar 128*f* may include the first pillar material (e.g., copper).

A solder material layer (e.g., as in solder material layer 121S') may then be formed (e.g., by an electro-chemical plating process) on the third pillar 128*f*. The first semiconductor device 123 and second semiconductor device 124 (having the upper bump 128UB formed thereon) may then be positioned in close proximity over the interposer dielectric 122 (having the lower pad 128LP formed thereon). A reflow process may then be performed in order to reflow (e.g., soften) the solder material layer and thereby form the solder joint 128S.

FIG. 3 is a flow chart illustrating a method of making a package assembly according to one or more embodiments. Step 310 includes forming a lower pad including a first conductive layer having a first diameter, and a second conductive layer on the first conductive layer and having a second diameter less than the first diameter. Step 320 includes forming an upper bump having a third diameter less than the first diameter. Step 330 includes forming a solder material on the upper bump. Step 340 includes reflowing the solder material onto the lower pad to form a solder joint between the upper bump and the lower pad.

Figure 4:
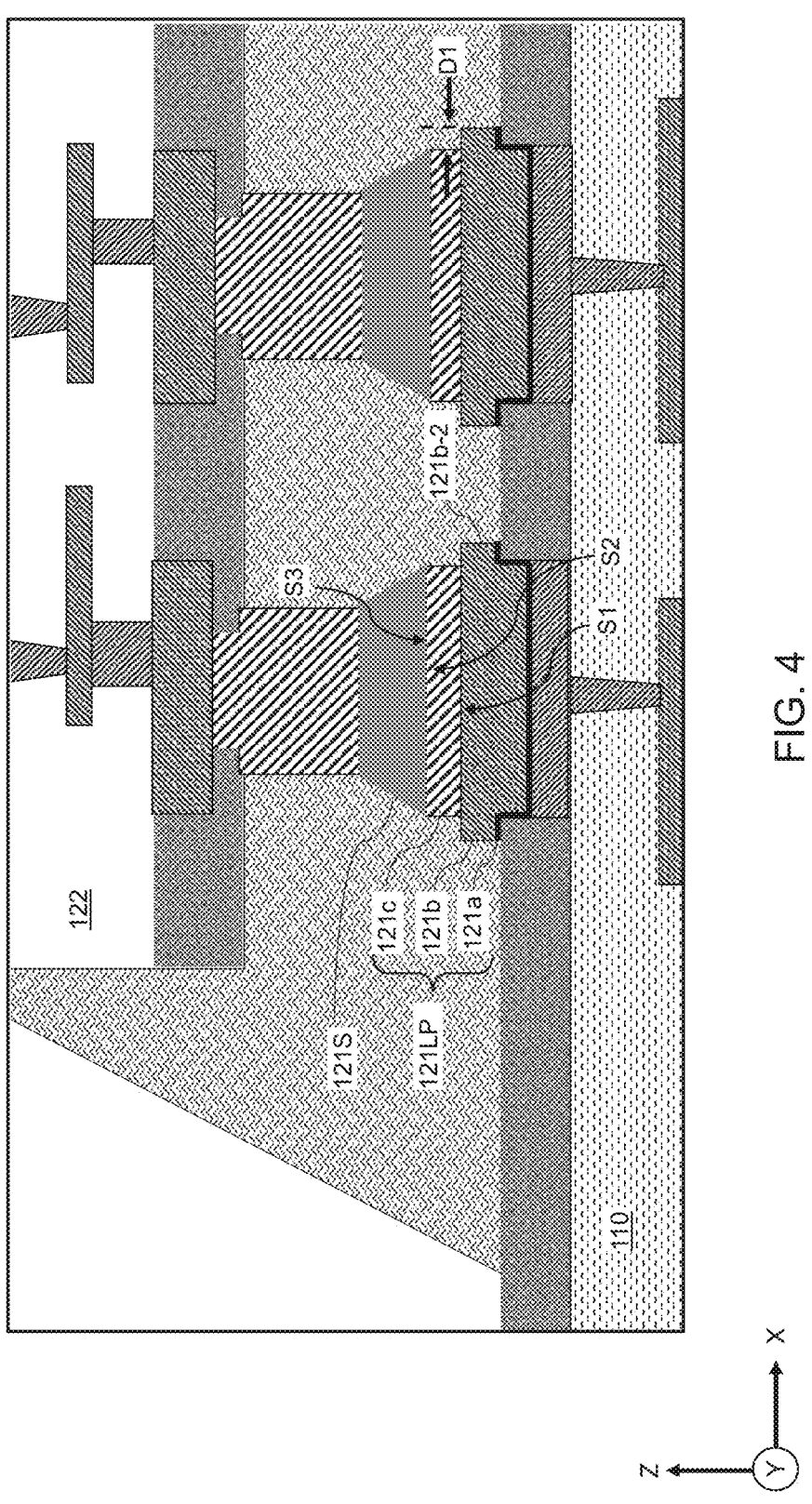
FIG. 4 is a vertical cross-sectional view of an alternative design of the first interconnect structure according to one or more embodiments.

FIG. 4 is a vertical cross-sectional view of an alternative design of the first interconnect structure 121 according to one or more embodiments. In the alternative design of FIG. 4, the lower pad 121LP and the solder joint 121S may have different designs than the designs illustrated in FIG. 1B. In particular, the first conductive layer upper portion 121*b*-2 may include a first substantially planar upper surface S1 (e.g., a flat upper surface). That is, the first conductive layer upper portion 121*b*-2 may not include a recess. The second conductive layer 121*c* may be located on the first substantially planar upper surface S1 and include a second substantially planar upper surface S2. That is, the second conductive layer 121*c* may have a completely planar design and that does not include a recess. As illustrated in FIG. 4, the outer wall of the second conductive layer 121*c* may be separated from the outer wall of the first conductive layer by the first distance D1. Thus, this alternative design may also include a step configuration similar to the step configuration in FIG.

1B. The solder joint 121S may include a substantially planar bottom surface S3 contacting the second substantially planar upper surface S2 of the second conductive layer 121*c*.

The first interconnect structure 121 having the alternative design may be formed by the method described above (e.g., see FIGS. 2A-2L). It should be noted that the first conductive layer 121*b* (e.g., a nickel pad) may have different configurations based, for example, on nickel plating and copper electroplating performance. For plating, the first conductive layer 121*b* (e.g., first conductive layer upper portion 121*b*-2) may not generally include a recess. However, if a Ni and Cu electrolyte include a special additive for high speed electroplating, then the first conductive layer 121*b* may have a substantially planar upper surface. Even without a recess in the first conductive layer 121*b* (e.g., nickel pad) and without a recess in the second conductive layer 121*c* (e.g., copper pad), the invention may help to reduce the risk of die slip and die shift (e.g., during flip chip bonding).

Figure 5:
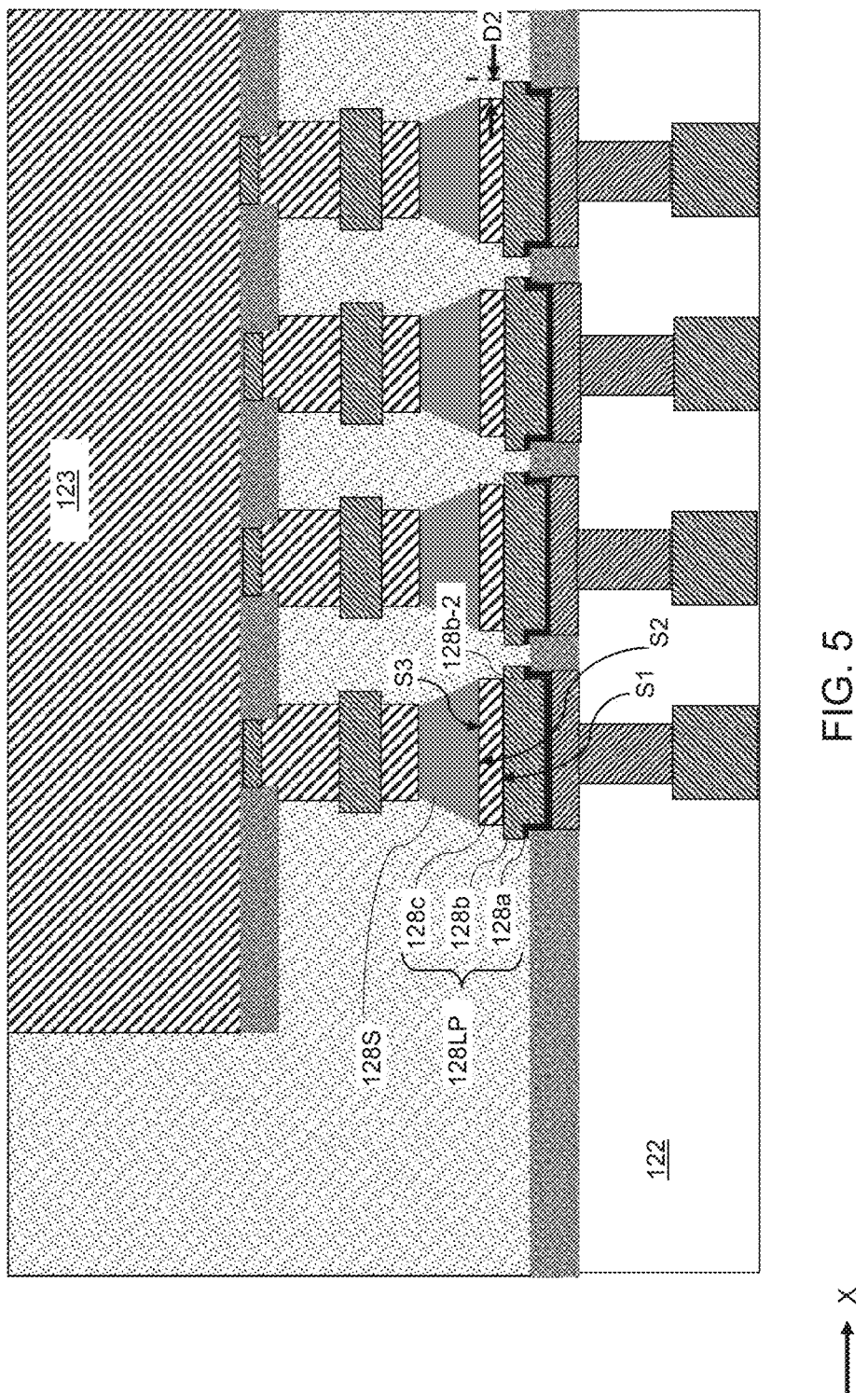
FIG. 5 is a vertical cross-sectional view of an alternative design of the second interconnect structure according to one or more embodiments.

FIG. 5 is a vertical cross-sectional view of an alternative design of the second interconnect structure 128 according to one or more embodiments. The alternative design of the interconnect structure 128 in FIG. 5 is similar to the alternative design of the interconnect structure 121 in FIG. 4. The first conductive layer upper portion 128*b*-2 may include a first substantially planar upper surface S1. The second conductive layer 128*c* may be located on the first substantially planar upper surface S1 and include a second substantially planar upper surface S2. The outer wall of the second conductive layer 128*c* may be separated from the outer wall of the first conductive layer by the second distance D2. Thus, this alternative design may also include a step configuration similar to the step configuration in FIG. 1D. The solder joint 128S may include a substantially planar bottom surface S3 contacting the second substantially planar upper surface S2 of the second conductive layer 128*c*. The second interconnect structure 128 having the alternative design may be formed by the method described above with reference to FIG. 1D.

Referring to FIGS. 1A-5, an interconnect structure 121, 128 includes a lower pad 121LP, 128LP including a first conductive layer 121*b*, 128*b* having a first diameter, and a second conductive layer 121*c*, 128*c* on the first conductive layer 121*b*, 128*b* and having a second diameter less than the first diameter, an upper bump 121UB, 128UB on the lower pad 121LP, 128LP and having a third diameter less than the first diameter, and a solder joint 121S, 128S between the upper bump 121UB, 128UB and the lower pad 121LP, 128LP.

In an embodiment, a ratio of the first diameter to the third diameter may be greater than 1 and less than 3.3. In one embodiment, the solder joint 121S, 128S may have a tapered sidewall connecting the upper bump 121UB, 128UB to the lower pad 121LP, 128LP, and may include tin and at least one of silver, indium, antimony, bismuth or zinc. In one embodiment, the first conductive layer 121*b*, 128*b* may include a nickel layer and the second conductive layer 121*c*, 128*c* may include a copper layer. In one embodiment, a thickness of the first conductive layer 121*b*, 128*b* may be greater than about 3 μm, and a thickness of the second conductive layer 121*c*, 128*c* may be in a range from 1 μm to 5 μm. In one embodiment, the upper bump 121UB, 128UB may include a first pillar 128*d* including a first pillar material and contacting the solder joint 121S, 128S. In one embodiment, the upper bump 128UB may include a first pillar 128*d* including a first pillar material, a second pillar 128*e* on the first pillar 128*d* and including a second pillar material that may be different than the first pillar material, and a third pillar 128*f* on the second pillar 128*e*, the third pillar 128*f* including the first pillar material and contacting the solder joint 121S, 128S. In one embodiment, the first conductive layer 121*b*, 128*b* may include a first conductive layer lower portion 121*b*-1, 128*b*-1, and a first conductive layer upper portion 121*b*-2, 128*b*-2 on the first conductive layer lower portion 121*b*-1, 128*b*-1, and the first diameter of the first conductive layer 121*b*, 128*b* may include an outer diameter of the first conductive layer upper portion 121*b*-2, 128*b*-2. In one embodiment, the second conductive layer 121*c*, 128*c* may include a second conductive layer lower portion 121*c*-1, 128*c*-1 in a first recess 121*b*-3, 128*b*-3 of the first conductive layer upper portion 121*b*-2, 128*b*-2, and a second conductive layer upper portion 121*c*-2, 128*c*-2 on the second conductive layer lower portion 121*c*-1, 128*c*-1 and including a second recess 121*c*-3, 128*c*-3 that may be substantially aligned with the first recess 121*b*-3, 128*b*-3 of the first conductive layer upper portion 121*b*-2, 128*b*-2, and the second diameter of the second conductive layer 121*c*, 128*c* may include an outer diameter of the second conductive layer upper portion 121*c*-2, 128*c*-2. In one embodiment, the solder joint 121S, 128S may include a main body 121S-1 extending from the upper bump 121UB, 128UB to an upper surface of the second conductive layer upper portion 121*c*-2, 128*c*-2, and an extension portion 121S-2 that extends from the main body 121S-1 into the second recess 121*c*-3, 128*c*-3 of the second conductive layer upper portion 121*c*-2, 128*c*-2. In one embodiment, the second recess 121*c*-3, 128*c*-3 in the second conductive layer upper portion 121*c*-2, 128*c*-2 may include a diameter that may be in a range from 40% to 70% of the second diameter, and a depth that may be greater than 0.2 μm. In one embodiment, the first conductive layer upper portion 121*b*-2, 128*b*-2 may include a first substantially planar upper surface S1. In one embodiment, the second conductive layer 121*c*, 128*c* may be on the first substantially planar upper surface S1 and may include a second substantially planar upper surface S2. In one embodiment, the solder joint 121S, 128S may include a substantially planar bottom surface S3 contacting the second substantially planar upper surface S2 of the second conductive layer 121*c*, 128*c*.

Referring to FIGS. 2A-3, a method of forming an interconnect structure 121, 128 may include forming a lower pad 121LP, 128LP including a first conductive layer 121*b*, 128*b* having a first diameter, and a second conductive layer 121*c*, 128*c* on the first conductive layer 121*b*, 128*b* and having a second diameter less than the first diameter, forming an upper bump 121UB, 128UB having a third diameter less than the first diameter, forming a solder material 121S' on the upper bump 121UB, 128UB, and reflowing the solder material 121S' to form a solder joint 121S, 128S between the upper bump 121UB, 128UB and the lower pad 121LP, 128LP.

In an embodiment, the method may further include forming the upper bump 121UB, 128UB, including forming a first pillar 121UB, 128*d* including a first pillar material. In an embodiment, the method may include forming of the solder material 121S' by forming the solder material 121S' on the first pillar 121UB, 128*d*. In an embodiment, the method may further include forming the upper bump 128UB, including forming a first pillar 128*d* including a first pillar material, forming a second pillar 128*e* on the first pillar 128*d*, the second pillar 128*e* including a second pillar material different than the first pillar material, and forming a third pillar 128*f* on the second pillar 128*e*, the third pillar 128*f* including the first pillar material. In an embodiment, the method may include forming of the solder material 121S', 128S' by forming the solder material 121S', 128S' on the third pillar 128*f*. In an embodiment, the method may include forming of the lower pad 121LP, 128LP by forming a second recess 121*c*-3, 128*c*-3 in the second conductive layer 121*c*, 128*c*, and the reflowing of the solder material 121S', 128S' may include reflowing the solder material 121S', 128S' into the second recess 121*c*-3, 128*c*-3. In an embodiment, the method may include forming of the lower pad 121LP, 128LP by forming a second substantially planar upper surface S2 on the second conductive layer 121*c*, 128*c*, and the reflowing of the solder material 121S', 128S' may include reflowing the solder material 121S', 128S' onto the second substantially planar upper surface S2.

Referring to FIGS. 1A-5, a package assembly 100 may include a package substrate 110, an interposer module 120 on the package substrate 110 and connected to the package substrate 110 by a first interconnect structure 121, the interposer module 120 including an interlayer dielectric 122, and a plurality of semiconductor dies 123, 124 on the interlayer dielectric 122 and connected to the interlayer dielectric 122 by a second interconnect structure 128. At least one of the first interconnect structure 121 or the second interconnect structure 128 includes a lower pad 121LP, 128LP including a first conductive layer 121*b*, 128*b* having a first diameter and including a first recess, and a second conductive layer 121*c*, 128*c* on the first conductive layer 121*b*, 128*b* and in the first recess having a second diameter less than the first diameter and including a second recess, an upper bump 121UB, 128UB on the lower pad 121LP, 128LP and having a third diameter less than the first diameter, and a solder joint 121S, 128S between the upper bump 121UB, 128UB and the lower pad 121LP, 128LP and in the second recess of the second conductive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure

What is claimed is:

1. An interconnect structure, comprising:
a lower pad comprising:
  a first conductive layer having a first diameter; and
  a second conductive layer on the first conductive layer and including a second conductive layer lower portion and a second conductive layer upper portion on the second conductive layer lower portion having a second diameter less than the first diameter, wherein an outermost sidewall of the second conductive layer upper portion contacts an upper surface of the first conductive layer and is separated from an outermost sidewall of the first conductive layer;
an upper bump on the lower pad, comprising a first portion, second portion and third portion, wherein the second portion is between the first portion and the third portion, wherein the second portion comprises a material different than a material of the first portion and a material of the third portion, wherein the second portion has a third diameter less than the first diameter and a sidewall of the third portion of the upper bump is over the second conductive layer lower portion; and a solder joint between the upper bump and the lower pad and including a tapered sidewall having a lower end located at the outermost sidewall of the second conductive layer upper portion and an upper end located at a sidewall of the third portion of the upper bump.

2. The interconnect structure of claim 1, wherein a ratio of the first diameter to the third diameter is greater than 1 and less than 3.3.

3. The interconnect structure of claim 1, wherein the solder joint connects the upper bump to the lower pad, and comprises tin and at least one of silver, indium, antimony, bismuth or zinc.

4. The interconnect structure of claim 1, wherein:

the first conductive layer comprises a nickel layer with a thickness greater than about 3 μm;

the second conductive layer comprises a copper layer with a thickness in a range from 1 μm to 5 μm; and the solder joint contacting the exposed upper surface of the first conductive layer forms a Cu—Ni—Sn intermetallic compound.

5. The interconnect structure of claim 1, wherein a material of the first conductive layer is the same as the material of the second portion of the upper bump, and the second portion of the upper bump has a thickness less than a thickness of the first portion of the upper bump and less than a thickness of the first portion of the upper bump.

6. The interconnect structure of claim 1, wherein the third diameter of the second portion of the upper bump is greater than a diameter of the third portion of the upper bump and less than the second diameter of the second conductive layer upper portion.

7. The interconnect structure of claim 1, wherein the first conductive layer comprises:

a first conductive layer lower portion; and a first conductive layer upper portion on the first conductive layer lower portion, wherein the first diameter of the first conductive layer comprises an outer diameter of the first conductive layer upper portion.

8. The interconnect structure of claim 7, wherein the second conductive layer upper portion comprises a second recess that is substantially aligned with the first recess of the first conductive layer upper portion, the second recess is bounded by an inner sidewall of the second conductive layer upper portion located over the first conductive layer lower portion, and a diameter of the second recess is less than the third diameter of the second portion of the upper bump.

9. The interconnect structure of claim 8, wherein the solder joint comprises:

a main body extending from the upper bump to an upper surface of the second conductive layer upper portion; and an extension portion that extends from the main body into the second recess of the second conductive layer upper portion.

10. The interconnect structure of claim 8, wherein the second recess in the second conductive layer upper portion includes a diameter that is in a range from 40% to 70% of the second diameter, and a depth that is greater than 0.2 μm.

11. The interconnect structure of claim 7, wherein the first conductive layer upper portion comprises a first substantially planar upper surface and the outer diameter of the first conductive layer upper portion comprises an outer diameter of the first substantially planar upper surface.

12. The interconnect structure of claim 11, wherein the second conductive layer is on the first substantially planar upper surface and comprises a second substantially planar upper surface and the outer diameter of the second conductive layer upper portion comprises an outer diameter of the second substantially planar upper surface.

13. The interconnect structure of claim 12, wherein the solder joint comprises a substantially planar bottom surface contacting the second substantially planar upper surface of the second conductive layer and having an outer diameter substantially the same as the outer diameter of the second substantially planar upper surface.

14. The interconnect structure of claim 1, wherein the tapered sidewall extends linearly from the outermost sidewall of the second conductive layer upper portion to the sidewall of the third portion of the upper bump.

15. A method of forming an interconnect structure, the method comprising:

forming a lower pad comprising:

a metallization layer;

a first conductive layer on the metallization layer and having a first diameter; and a second conductive layer on the first conductive layer and including a second conductive layer lower portion and a second conductive layer upper portion on the second conductive layer lower portion having a second diameter less than the first diameter, wherein an outermost sidewall of the second conductive layer upper portion is located over the metallization layer, contacts an upper surface of the first conductive layer and is separated from an outermost sidewall of the first conductive layer;

forming an upper bump having a third diameter less than the first diameter;

forming a solder material on the upper bump;

positioning the upper bump over the lower pad such that a sidewall of the upper bump is over the lower portion of the second conductive layer; and reflowing the solder material to form a solder joint between the upper bump and the lower pad such that the solder joint includes a tapered sidewall having a lower end located at the outermost sidewall of the second conductive layer upper portion and an upper end located at a sidewall of the upper bump.

16. The method of claim 15, wherein the first conductive layer contacts an upper surface of the metallization layer and the second conductive layer contacts an upper surface of the first conductive layer.

17. The method of claim 15, wherein the forming of the upper bump comprises:

forming a first pillar including a first pillar material;

forming a second pillar on the first pillar, the second pillar including a second pillar material different than the first pillar material; and forming a third pillar on the second pillar, the third pillar including the first pillar material, and wherein the forming of the solder material comprises forming the solder material on the third pillar.

18. The method of claim 15, wherein the forming of the lower pad comprises forming a second recess in the second conductive layer, and the reflowing of the solder material comprises reflowing the solder material into the second recess.

19. The method of claim 15, wherein the forming of the lower pad comprises forming a second substantially planar upper surface on the second conductive layer, and the reflowing of the solder material comprises reflowing the solder material onto the second substantially planar upper surface.

20. A package assembly, comprising:

a package substrate;

an interposer module on the package substrate and connected to the package substrate by a first interconnect structure, the interposer module comprising:

an interlayer dielectric; and a plurality of semiconductor dies on the interlayer dielectric and connected to the interlayer dielectric by a second interconnect structure, wherein at least one of the first interconnect structure or the second interconnect structure comprises:

a lower pad comprising:

a metallization layer;

a first conductive layer on the metallization layer and having a first diameter and including a first recess; and a second conductive layer on the first conductive layer and in the first recess, wherein the second conductive layer includes a second conductive layer lower portion and a second conductive layer upper portion on the second conductive layer lower portion having a second diameter less than the first diameter, and wherein the second conductive layer upper portion includes a second recess and an outermost sidewall of the second conductive layer upper portion is located over the metallization layer, contacts an upper surface of the first conductive layer and is separated from an outermost sidewall of the first conductive layer;

an upper bump on the lower pad and having a third diameter less than the first diameter, wherein a sidewall of the upper bump is over the second conductive layer lower portion; and a solder joint between the upper bump and the lower pad and in the second recess of the second conductive layer, wherein the solder joint includes a tapered sidewall having a lower end located at the outermost sidewall of the second conductive layer upper portion and an upper end located at a sidewall of the upper bump.

* * * * *